(12) United States Patent
Obata et al.

(10) Patent No.: US 10,597,768 B2
(45) Date of Patent: Mar. 24, 2020

(54) VAPOR DEPOSITION MASK, VAPOR DEPOSITION MASK PREPARATION BODY, METHOD FOR PRODUCING VAPOR DEPOSITION MASK, AND METHOD FOR PRODUCING ORGANIC SEMICONDUCTOR ELEMENT

(71) Applicant: Dai Nippon Printing Co., Ltd., Tokyo (JP)

(72) Inventors: Katsunari Obata, Tokyo (JP); Toshihiko Takeda, Tokyo (JP); Hiroshi Kawasaki, Tokyo (JP); Hiroyuki Nishimura, Tokyo (JP); Atsushi Maki, Tokyo (JP); Hiromitsu Ochiai, Tokyo (JP); Yoshinori Hirobe, Tokyo (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 0 days.

(21) Appl. No.: 16/190,453

(22) Filed: Nov. 14, 2018

(65) Prior Publication Data

US 2019/0100835 A1 Apr. 4, 2019

Related U.S. Application Data

(63) Continuation of application No. 14/779,738, filed as application No. PCT/JP2014/058045 on Mar. 24, 2014.

(30) Foreign Application Priority Data

Mar. 26, 2013 (JP) .................... 2013-063295
Mar. 24, 2014 (JP) .................... 2014-059432

(51) Int. Cl.
*H01L 21/00* (2006.01)
*C23C 14/04* (2006.01)
(Continued)

(52) U.S. Cl.
CPC .......... *C23C 14/042* (2013.01); *C23C 14/048* (2013.01); *H01L 51/0011* (2013.01); *H01L 51/56* (2013.01)

(58) Field of Classification Search
CPC ..... H01L 51/56; H01L 51/0011; H01L 51/00; C23C 14/042; C23C 14/048; C23C 14/04; C23C 14/044
See application file for complete search history.

(56) References Cited

U.S. PATENT DOCUMENTS 6,893,575 B2 5/2005 Yotsuya
2005/0166842 A1* 8/2005 Sakamoto ............. C23C 14/042
118/721
(Continued)

FOREIGN PATENT DOCUMENTS

CN         1431851 A     7/2003
CN       101220452 A     7/2008
(Continued)

OTHER PUBLICATIONS

International Search Report (Application No. PCT/JP2014/058045) dated Jun. 17, 2014.
(Continued)

*Primary Examiner* — Evren Seven
(74) *Attorney, Agent, or Firm* — Burr & Brown, PLLC

(57) ABSTRACT

There are provided a vapor deposition mask capable of satisfying both high definition and lightweight in upsizing and forming a vapor deposition pattern with high definition while securing strength, a vapor deposition mask preparation body capable of simply producing the vapor deposition mask and a method for producing a vapor deposition mask, and furthermore, a method for producing an organic semiconductor element capable of producing an organic semiconductor element with high definition. A metal mask 10 in which a slit 15 is provided and a resin mask 20 in which (Continued)

openings 25 corresponding to a pattern to be produced by vapor deposition are provided at a position of overlapping with the slit 15 are stacked, and the metal mask 10 has a general region 10a in which the slit 15 is provided and a thick region 10b larger in thickness than the general region.

14 Claims, 14 Drawing Sheets

(51) Int. Cl.
*H01L 51/00* (2006.01)
*H01L 51/56* (2006.01)

(56) References Cited

U.S. PATENT DOCUMENTS

| | | | |
|---|---|---|---|
| 2008/0314743 A1 | 12/2008 | Lee et al. | |
| 2013/0015444 A1* | 1/2013 | Hirai | C23C 14/042 257/57 |
| 2014/0033980 A1* | 2/2014 | Jeong | C23C 16/042 118/720 |
| 2014/0199808 A1 | 7/2014 | Sugimoto et al. | |
| 2014/0377903 A1* | 12/2014 | Takeda | C23C 14/042 438/99 |
| 2015/0017759 A1* | 1/2015 | Hirobe | C23C 14/24 438/99 |
| 2015/0037928 A1* | 2/2015 | Hirobe | C23C 14/042 438/99 |
| 2016/0047030 A1 | 2/2016 | Obata et al. | |

FOREIGN PATENT DOCUMENTS

| | | |
|---|---|---|
| JP | H07-300664 A1 | 11/1995 |
| JP | 11-214154 A1 | 8/1999 |
| JP | 2002-175878 A1 | 6/2002 |
| JP | 2002-212721 A1 | 7/2002 |
| JP | 2003-100452 A1 | 4/2003 |
| JP | 2003-272838 A1 | 9/2003 |
| JP | 2003-332057 A1 | 11/2003 |
| JP | 2004-190057 A1 | 7/2004 |
| JP | 2004323888 A * | 11/2004 |
| JP | 2005-146338 A | 6/2005 |
| JP | 2005-302457 A1 | 10/2005 |
| JP | 2007-173107 A1 | 7/2007 |
| JP | 2008-208426 A | 9/2008 |
| JP | 2013-021165 A1 | 1/2013 |
| JP | 2014-098194 A1 | 5/2014 |
| JP | 2014-098196 A1 | 5/2014 |
| JP | 2014-208899 A1 | 11/2014 |
| WO | 2013/039196 A1 | 3/2013 |

OTHER PUBLICATIONS

Japanese Office Action (Application No. 2015-183439) dated Aug. 1, 2017 (with English translation).

Chinese Office Action (Application No. 201480017634.6) dated Aug. 28, 2017 (with English translation).

* cited by examiner (a)

(b)

VAPOR DEPOSITION MASK, VAPOR DEPOSITION MASK PREPARATION BODY, METHOD FOR PRODUCING VAPOR DEPOSITION MASK, AND METHOD FOR PRODUCING ORGANIC SEMICONDUCTOR ELEMENT

CROSS REFERENCE TO RELATED APPLICATIONS

This application is a continuation of U.S. application Ser. No. 14/779,738, filed Sep. 24, 2015, which in turn is the National Stage entry of International Application No. PCT/JP2014/058045, filed Mar. 24, 2014, which designated the United States, the entireties of which are incorporated herein by reference.

FIELD OF THE INVENTION

The present invention relates to a vapor deposition mask, a vapor deposition mask preparation body, a method for producing a vapor deposition mask, and a method for producing an organic semiconductor element.

BACKGROUND OF THE INVENTION

Conventionally, in production of an organic EL element, a vapor deposition mask that is composed of a metal formed by a number of microscopic slits being arranged in parallel with one another at microscopic spaces in a region that should be subjected to vapor deposition, for example, has been used in formation of an organic layer or a cathode electrode of an organic EL element. While in the case of using the vapor deposition mask, the vapor deposition mask is placed on a substrate front surface that should be subjected to vapor deposition and is held by using a magnet from a back surface, the rigidity of the slits is extremely small, and therefore, distortion easily occurs to the slits when the vapor deposition mask is held on the substrate front surface, which becomes an obstacle to enhancement in definition or upsizing of the products in which the slit lengths are large.

Various studies have been made on the vapor deposition masks for preventing distortion of slits, and, for example, Patent Literature 1 proposes a vapor deposition mask including a base plate that also serves a first metal mask including a plurality of openings, a second metal mask including a number of microscopic slits in regions to cover the aforementioned openings, and a mask pulling and holding device that positions the second metal mask on the base plate in a state of being pulled in the longitudinal direction of the slits. Namely, the vapor deposition mask with two kinds of metal masks being combined is proposed. It is indicated that according to the vapor deposition mask, slit precision can be ensured without occurrence of distortion to the slits.

Incidentally, in recent years, with upsizing of the products using organic EL elements or increase in substrate sizes, a demand for upsizing is also growing with respect to vapor deposition masks, and the metal plates for use in production of the vapor deposition masks composed of metals are also upsized. However, with the present metal processing technique, it is difficult to form slits in a large metal plate with high precision, and even if distortion in slit portions can be prevented by the method proposed in the above-described Patent Literature 1 or the like, these cannot respond to enhancement in definition of the slits. Further, in the case of use of a vapor deposition mask composed of only a metal, the weight thereof also increases with upsizing, and the total mass including a frame also increases, which becomes a hindrance to handling.

In the vapor deposition mask proposed above, in order to reduce the weight of the vapor deposition mask, it is needed that the thickness of the vapor deposition mask composed of a metal be made small. However, in the case where the thickness of the vapor deposition mask composed of a metal is made small, the strength of the vapor deposition mask decreases by that amount, and there arise the new problems that the vapor deposition mask suffers deformation and that handling becomes difficult.

CITATION LIST

Patent Literature

Patent Literature 1: Japanese Patent Laid-Open No. 2003-332057

SUMMARY OF THE INVENTION

Technical Problem

The present invention is devised in view of the above-mentioned circumstances, and primary objects thereof are to provide a vapor deposition mask capable of satisfying both high definition and lightweight in upsizing and forming a vapor deposition pattern with high definition while the strength is secured, to provide a vapor deposition mask preparation body and a method for producing a vapor deposition mask capable of simply producing the vapor deposition mask, and furthermore, to provide a method for producing an organic semiconductor element capable of producing an organic semiconductor element excellent in precision.

Solution to Problem

According to the present invention to solve the above-mentioned problems, there is provided a vapor deposition mask including: a metal mask in which a slit is provided; and a resin mask in which openings corresponding to a pattern to be produced by vapor deposition are provided at a position of overlapping with the slit, the metal mask and the resin mask being stacked, wherein the metal mask has a general region in which the slit is provided and a thick region larger in thickness than the general region.

In the above-mentioned vapor deposition mask, a thickness of the general region may be from 5 μm to 25 μm inclusive.

Moreover, according to the present invention to solve the above-mentioned problems, there is provided a vapor deposition mask preparation body for obtaining a vapor deposition mask including: a metal mask in which a slit is provided; and a resin mask in which openings corresponding to a pattern to be produced by vapor deposition are provided at a position of overlapping with the slit, the metal mask and the resin mask being stacked, wherein the metal mask in which the slit is provided is stacked on one surface of a resin plate, and the metal mask has a general region in which the slit is provided and a thick region larger in thickness than the general region.

Moreover, according to the present invention to solve the above-mentioned problems, there is provided a method for producing a vapor deposition mask, including: a step of pasting a metal mask in which a slit is provided and a resin plate together; and a step of forming openings corresponding to a pattern to be produced by vapor deposition in the resin plate by irradiation with laser from the metal mask side, wherein as the metal mask, a metal mask having a general region in which the slit is provided and a thick region larger in thickness than the general region is used.

Moreover, the metal mask used in the above-mentioned production method may be a metal mask obtained by a step of forming the general region by masking of a part of the metal plate to be the thick region and slimming processing of a region in the metal plate that does not undergo the masking, and by forming the slit in the general region.

Moreover, in the above-mentioned production method, after the metal mask that the resin plate is pasted on is fixed onto a frame, the step of forming the openings corresponding to the pattern to be produced by vapor deposition in the resin plate by irradiation with laser from the metal mask side may be performed.

Moreover, according to the present invention to solve the above-mentioned problems, there is provided a method for producing an organic semiconductor element, including: a step of forming a vapor deposition pattern on a vapor deposition target by using a frame-equipped vapor deposition mask in which a vapor deposition mask is fixed to a frame, wherein the vapor deposition mask fixed to the frame in the step of forming the vapor deposition pattern includes: a metal mask in which a slit is provided; and a resin mask in which openings corresponding to a pattern to be produced by vapor deposition are provided at a position of overlapping with the slit, the metal mask and the resin mask being stacked, the metal mask having a general region in which the slit is provided and a thick region larger in thickness than the general region.

Advantageous Effect of Invention

According to the vapor deposition mask of an embodiment of the present invention, both high definition and lightweight in upsizing can be satisfied, and a vapor deposition pattern with high definition can be formed while securing strength. Moreover, according to the vapor deposition mask preparation body and the method for producing a vapor deposition mask of an embodiment of the present invention, the vapor deposition mask characteristic in the above can be simply produced. Moreover, according to the method for producing an organic semiconductor element of an embodiment of the present invention, an organic semiconductor element can be produced excellent in precision.

DETAILED DESCRIPTION OF THE INVENTION

Hereafter, a vapor deposition mask 100 of an embodiment of the present invention is specifically described with use of the drawings.

Figure 1:
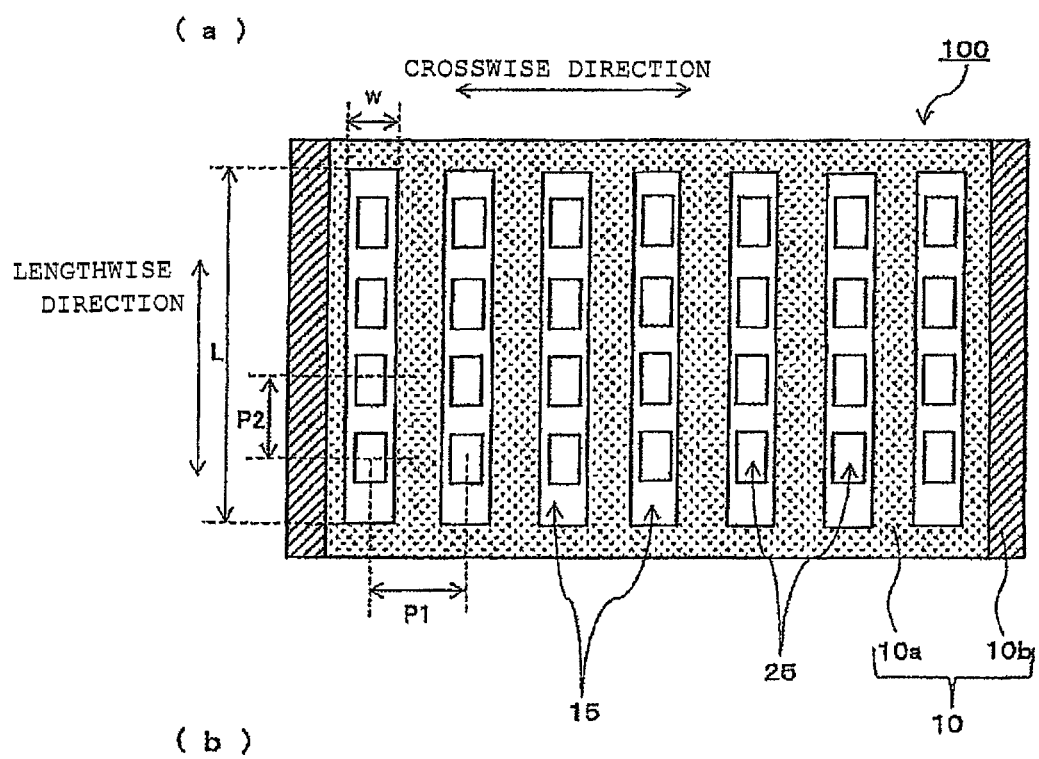
In FIG. 1, portion (a) is an elevation view of a vapor deposition mask of an embodiment as seen from a metal mask side, and portion (b) is a schematic cross-sectional view of the vapor deposition mask of an embodiment.
Figure 1:
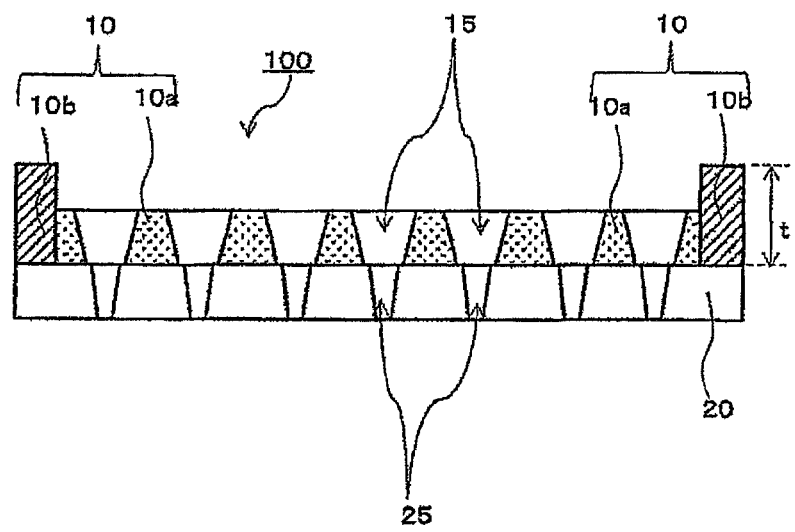
Figure 2:
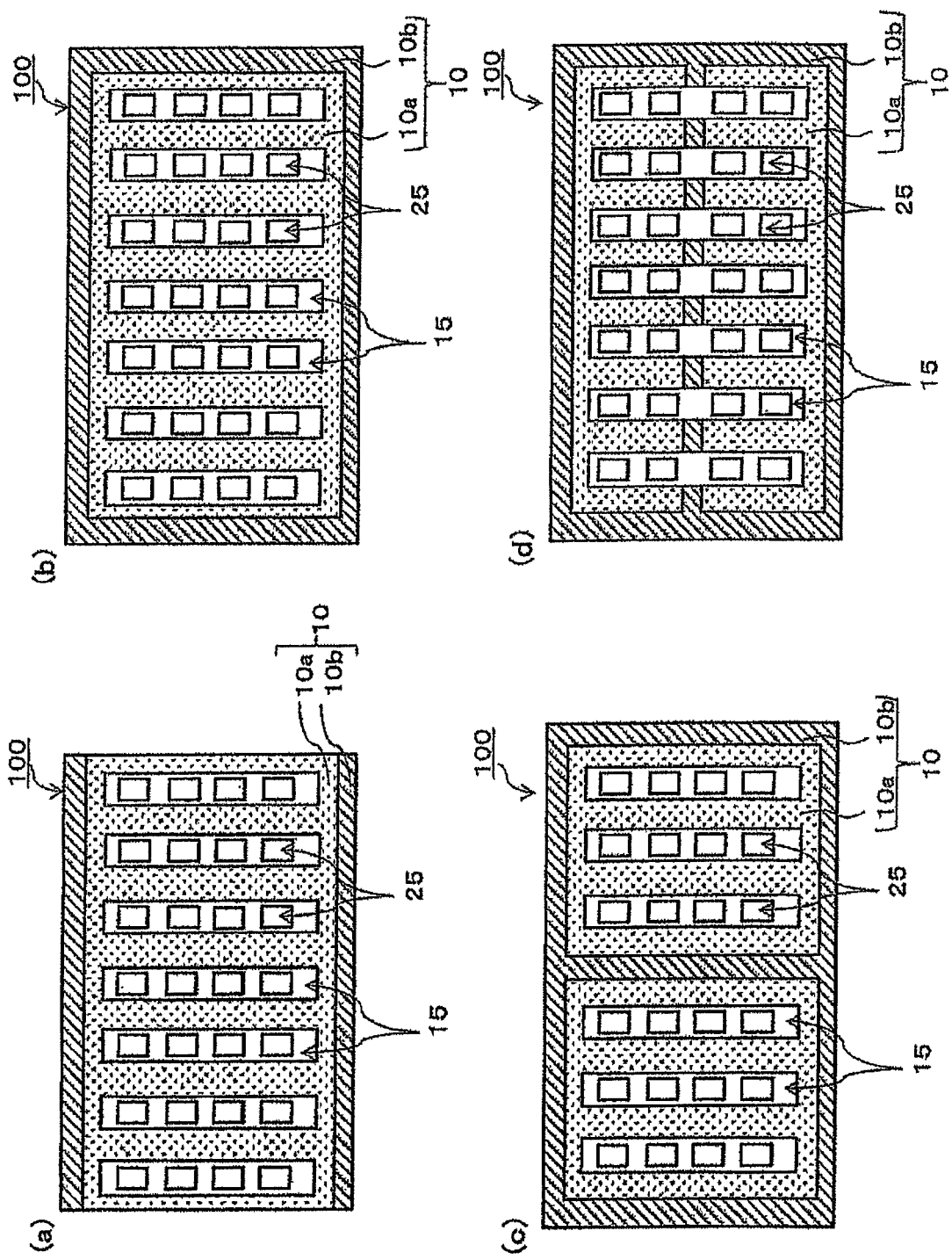
In FIG. 2, portions (a) to (d) are elevation views of vapor deposition masks of an embodiment as seen from the metal mask side.
Figure 3:
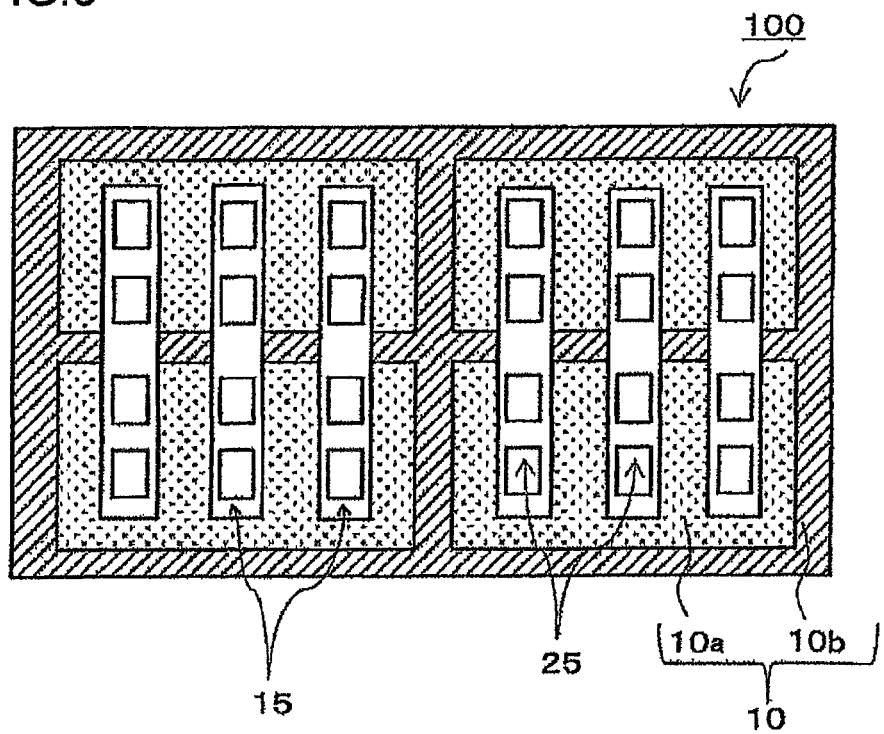
FIG. 3 is an elevation view of the vapor deposition mask of an embodiment as seen from the metal mask side.
Figure 4:
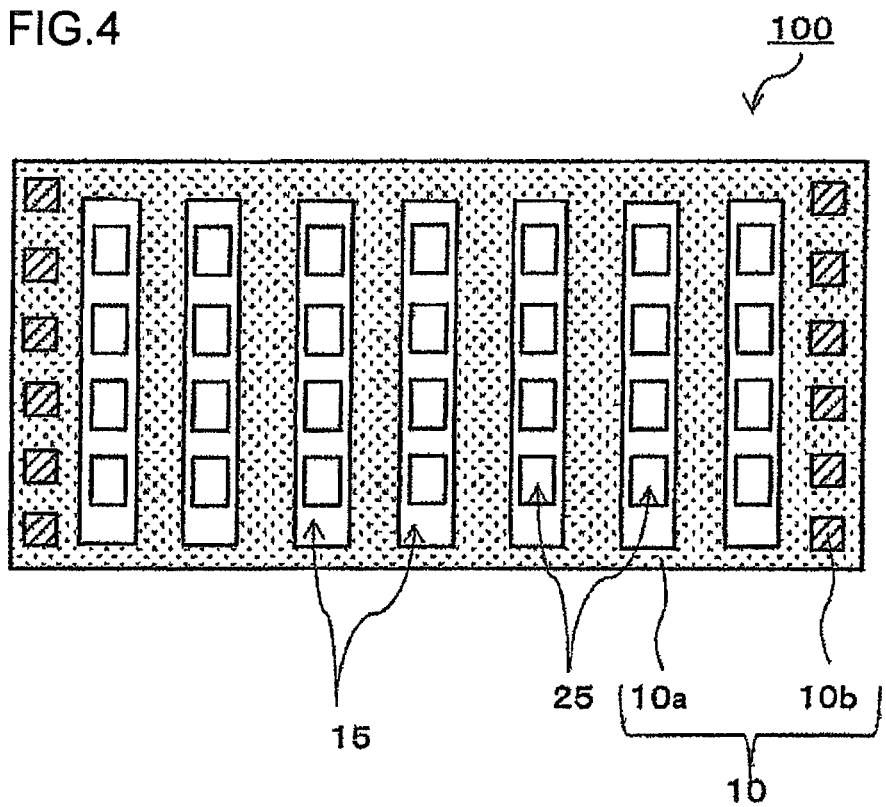
FIG. 4 is an elevation view of the vapor deposition mask of an embodiment as seen from the metal mask side.

FIG. 1(*a*) is an elevation view of a vapor deposition mask of an embodiment of the present invention as seen from a metal mask side, and FIG. 1(*b*) is a schematic cross-sectional view of FIG. 1(*a*). Moreover, FIG. 2 to FIG. 4 are elevation views of the vapor deposition mask of an embodiment as seen from the metal mask side. Notably, Regions indicated by shaded parts in FIGS. 1(*a*) and (*b*) and FIG. 2 to FIG. 4 are thick regions 10*b*, and a metal mask 10 is constituted integrally of a general region 10*a* and the thick region 10*b*. Hereafter, while vapor deposition masks in the shown modes are mainly described, the present invention is not limited to the shown modes.

As shown in FIG. 1(*b*), the vapor deposition mask 100 of an embodiment has a configuration in which the metal mask 10 in which slits 15 are provided, and a resin mask 20 which is positioned on a surface of the metal mask 10 (on the lower surface of the metal mask 10 in the case shown in FIG. 1(*b*)) and in which openings 25 corresponding to a pattern to be produced by vapor deposition at positions of overlapping with the slits 15 are provided are stacked.

Here, when the mass of the vapor deposition mask 100 of an embodiment and the mass of a conventionally known vapor deposition mask composed of only metal are compared on the assumption that the thicknesses of the vapor deposition masks are the same as a whole, the mass of the vapor deposition mask 100 of the present invention is lighter by an amount by which the metal material of the conventionally known vapor deposition mask is partially replaced with a resin material. Moreover, in order to reduce weight by using the vapor deposition mask composed of only metal, there are a requirement that the thickness of the relevant vapor deposition mask should be made small and the similar requirement, but in the case where the thickness of the vapor deposition mask is made small, there can arise the case where distortion is generated in the vapor deposition mask and the case where durability deteriorates when upsizing the vapor deposition mask. Meanwhile, according to the vapor deposition mask of an embodiment of the present invention, even when the thickness of the vapor deposition mask is made large as a whole to satisfy distortion and durability in upsizing, reduction in weight can be achieved more than the vapor deposition mask formed of only metal by the presence of the resin mask 20. Hereafter, each of these is specifically described.

Resin Mask

The resin mask 20 is composed of a resin, and as shown in FIG. 1(b), the openings 25 corresponding to the pattern to be produced by vapor deposition are provided at the position of overlapping with the slits 15. Notably, in the present specification, the pattern to be produced by vapor deposition means a pattern which is going to be produced with use of the relevant vapor deposition mask, and, for example, in the case where the relevant vapor deposition mask is used for forming an organic layer of an organic EL element, it has a shape of the relevant organic layer. Moreover, in the shown mode, while the openings arranged in a plurality of rows in the lengthwise direction and the crosswise direction are exemplarily described, the openings 25 only have to be provided at the positions of overlapping with the slits 15. In the case where the slit 15 is disposed for only one row in the lengthwise direction or the crosswise direction, the openings 25 only have to be provided at a position of overlapping with the relevant slit 15 for one row.

For the resin mask 20, a conventionally known resin material can be properly selected and used, and while the material is not specially limited, a material that enables formation of the opening 25 with high definition by laser processing or the like, has a low rate of dimensional change and a low rate of humidity absorption under heat and with passage of time, and is lightweight, is preferably used. As such materials, a polyimide resin, a polyamide resin, a polyamide-imide resin, a polyester resin, a polyethylene resin, a polyvinylalcohol resin, a polypropylene resin, a polycarbonate resin, a polystyrene resin, a polyacrylonitrile resin, an ethylene-vinyl acetate copolymer resin, an ethylene-vinyl alcohol copolymer resin, an ethylene-methacrylic acid copolymer resin, a polyvinyl chloride resin, a polyvinylidene chloride resin, cellophane, an ionomer resin and the like can be cited. Among the materials shown in the above, the resin materials with the thermal expansion coefficients of 16 ppm/° C. or less are preferable, the resin materials with the rates of humidity absorption of 1.0% or less are preferable, and the resin materials including both conditions are especially preferable. The resin mask using this resin material can improve dimensional accuracy of the opening 25, and enables a rate of dimensional change and a rate of humidity absorption under heat and with passage of time to be small. In the present invention, the resin mask 20 is composed of the resin material as mentioned above which enables formation of the opening 25 with high definition as compared with a metal material. This can make the vapor deposition mask 100 have the opening 25 with high definition.

While the thickness of the resin mask 20 is not specially limited, in order to prevent an insufficient vapor deposition portion, in other words, a vapor deposition portion whose film thickness is smaller than the intended vapor deposition film thickness, a so-called shadow from arising in the pattern to be produced by vapor deposition at the time of performing vapor deposition with use of the vapor deposition mask 100 of an embodiment of the present invention, the resin mask 20 is preferably as thin as possible. However, when the thickness of the resin mask 20 is less than 3 µm, a defect such as a pinhole easily occurs, and the risk of deformation or the like increases. Meanwhile, in the case of exceeding 25 µm, generation of a shadow can arise. With this point taken into consideration, the thickness of the resin mask 20 is preferably from 3 µm to 25 µm inclusive. By setting the thickness of the resin mask 20 within this range, the defect such as a pinhole and the risk of deformation or the like can be reduced, and generation of a shadow can be effectively prevented. In particular, the thickness of the resin mask 20 is set to be from 3 µm to 10 µm inclusive, more preferably, from 4 µm to 8 µm inclusive, whereby the influence of a shadow at the time of forming a high-definition pattern exceeding 300 ppi can be prevented more effectively. Notably, in the vapor deposition mask 100 of an embodiment of the present invention, the metal mask 10 and the resin mask 20 may be directly bonded, or may be bonded via an adhesive layer, and when the metal mask 10 and the resin mask 20 are bonded via the adhesive layer, with the above-mentioned point of the shadow taken into consideration, the total thickness of the resin mask 20 and the adhesive layer is preferably set to be within a range from 3 µm to 25 µm inclusive, preferably from 3 µm to 10 µm inclusive, and particularly preferably from 4 µm to 8 µm inclusive.

The shape and the dimension of the openings 25 are not specially limited, but they only have to be a shape and a dimension corresponding to the pattern to be produced by vapor deposition. Moreover, as shown in FIG. 1(a), a pitch P1 between the neighboring openings 25 in the crosswise direction and a pitch P2 between these in the lengthwise direction can also be properly set depending on the pattern to be produced by vapor deposition.

Figure 5:
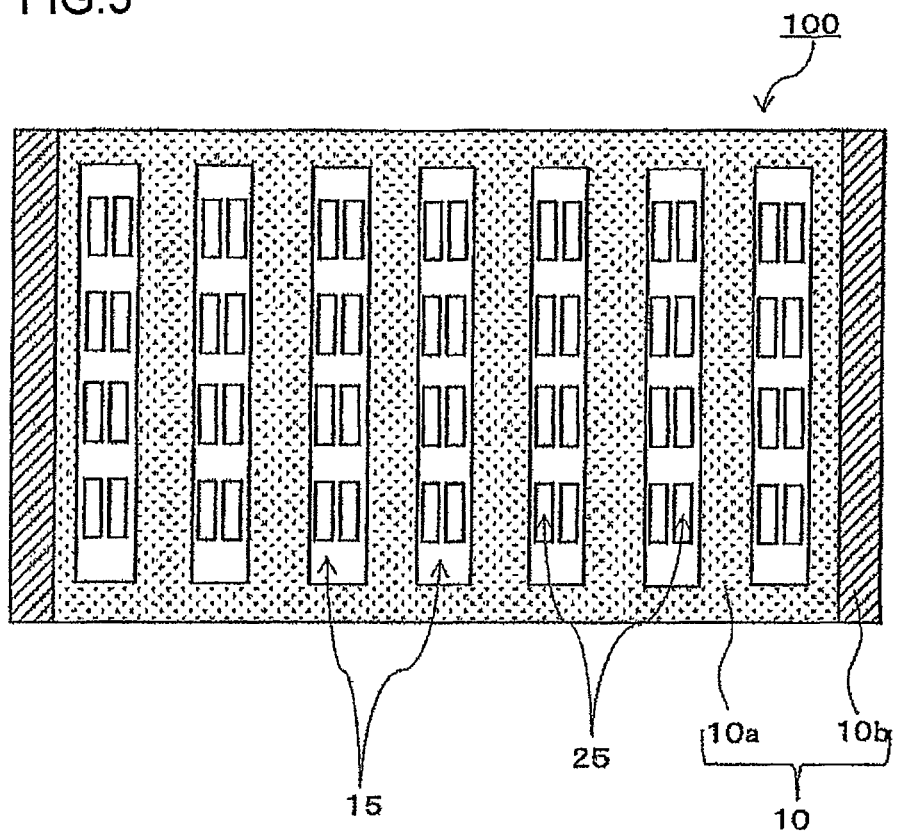
FIG. 5 is an elevation view of the vapor deposition mask of an embodiment as seen from the metal mask side.

The position of providing the openings 25 and the number of the openings 25 are not specially limited, but one may be provided at the position of overlapping with the slit 15, or the plurality of ones may be provided in the lengthwise direction or the crosswise direction. For example, as shown in FIG. 5, in the case where the slit extends in the lengthwise direction, two or more openings 25 overlapping with the relevant slit 15 may be provided in the crosswise direction.

Figure 6:
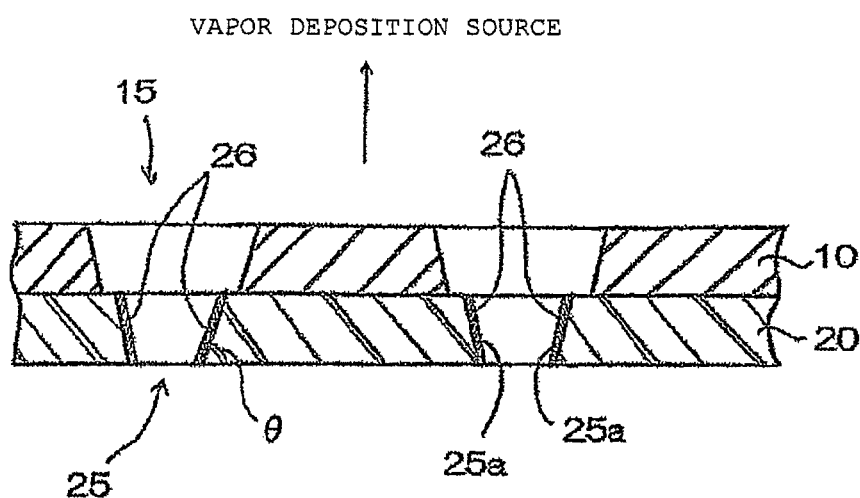
FIG. 6 is a partial expanded cross-sectional view of the vapor deposition mask 100 of an embodiment.

The sectional shape of the opening 25 is not specially limited, and end surfaces that face each other of the resin mask forming the opening 25 may be substantially parallel to each other, but as shown in FIG. 1(b) and FIG. 6, the sectional shape of the opening 25 is preferably the shape having broadening toward a vapor deposition source. In other words, it preferably has a taper surface having broadening toward the metal mask 10 side. By making the sectional shape of the opening 25 have the above configuration, a shadow can be prevented from being generated in the pattern that is produced by vapor deposition when vapor deposition is performed with use of the vapor deposition mask of an embodiment of the present invention. While a taper angle θ can be properly set with the thickness or the like of the resin mask 20 taken into consideration, an angle (θ) formed by a straight line connecting a lower bottom distal end in the opening of the resin mask and an upper bottom distal end of the opening of the same resin mask and the bottom surface of the resin mask, in other words, an angle (θ) formed by an inner wall surface of the opening 25 and a surface of the resin mask 20 on the side that is not in contact with the metal mask 10 (a lower surface of the resin mask in the shown mode) in the cross section in the thickness direction of the inner wall surface composing the opening 25 of the resin mask 20 is preferably within a range of 5° to 85°, more preferably within a range of 15° to 80°, further preferably within a range of 25° to 65°. In particular, within this range, it is preferably an angle smaller than a vapor deposition angle of a vapor deposition machine to be used. Furthermore, in FIG. 1(b) and FIG. 6, an end surface 25a that forms the opening 25 shows a linear shape, but is not limited thereto, and may be in a curved shape protruding outward, in other words, a shape of the entirety of the opening 25 may be in a bowl shape. The opening 25 that has the sectional shape like this can be formed by performing multistage laser irradiation that properly adjusts the irradiation position of the laser and irradiation energy of the laser at the time of formation of the opening 25, or changes the irradiation position stepwise, for example. Notably, FIG. 6 is a partial expanded cross-sectional view exemplarily showing the vapor deposition mask 100 of an embodiment of the present invention.

Since a resin material is used for the resin mask 20, formation of the opening 25 is enabled without using the processing methods that are used in the conventional metal processing, for example, the processing methods such as etching and cutting. In other words, the method for forming the opening 25 is not specially limited, and the opening 25 can be formed by using various processing methods, for example, a laser processing method capable of forming the opening 25 with high definition, precision press processing, photolithography processing and the like. The method for forming the opening 25 by a laser processing method or the like will be described later.

As the etching processing method, for example, a wet etching method such as a spray etching method that sprays an etching agent at a predetermined spray pressure from an injection nozzle, an immersion etching method that immerses an object in an etching solution filled with an etching agent, and a spin etching method that drops an etching agent, and a dry etching method using gas, plasma and the like can be used.

Moreover, in the present invention, since the resin mask 20 is used as the configuration of the vapor deposition mask 100, when vapor deposition is performed with use of this vapor deposition mask 100, exceedingly high heat is applied to the opening 25 of the resin mask 20, and risks that gas is generated from the end surface 25a forming the opening 25 of the resin mask 20 (refer to FIG. 6) to lower the degree of vacuum in the vapor deposition apparatus can arise. Accordingly, with this point taken into consideration, as shown in FIG. 6, a barrier layer 26 is preferably provided on the end surface 25a forming the opening 25 of the resin mask 20. By forming the barrier layer 26, gas can be prevented from being generated from the end surface 25a forming the opening 25 of the resin mask 20.

As the barrier layer 26, a thin film layer or a vapor deposition layer of an inorganic oxide, an inorganic nitride or metal can be used. As the inorganic oxide, an oxide of aluminum, silicon, indium, tin or magnesium can be used, and as the metal, aluminum or the like can be used. The thickness of the barrier layer 26 is preferably approximately 0.05 μm to 1 μm.

Furthermore, the barrier layer preferably covers the vapor deposition source-side surface of the resin mask 20. By covering the vapor deposition source-side surface of the resin mask 20 with the barrier layer 26, barrier ability is further improved. In the case of an inorganic oxide and an inorganic nitride, the barrier layer is preferably formed by various PVD (physical vapor deposition) methods and CVD (chemical vapor deposition) methods. In the case of metal, the formation is preferably performed by various PVD methods such as a sputtering method, ion plating, a vacuum vapor deposition method, in particular, the vacuum vapor deposition method. Notably, the vapor deposition source-side surface of the resin mask 20 here may be the entirety of the surface on the vapor deposition source side of the resin mask 20, or may be only the part that is exposed from the metal mask on the surface of the resin mask 20 on the vapor deposition source side.

Figure 7:
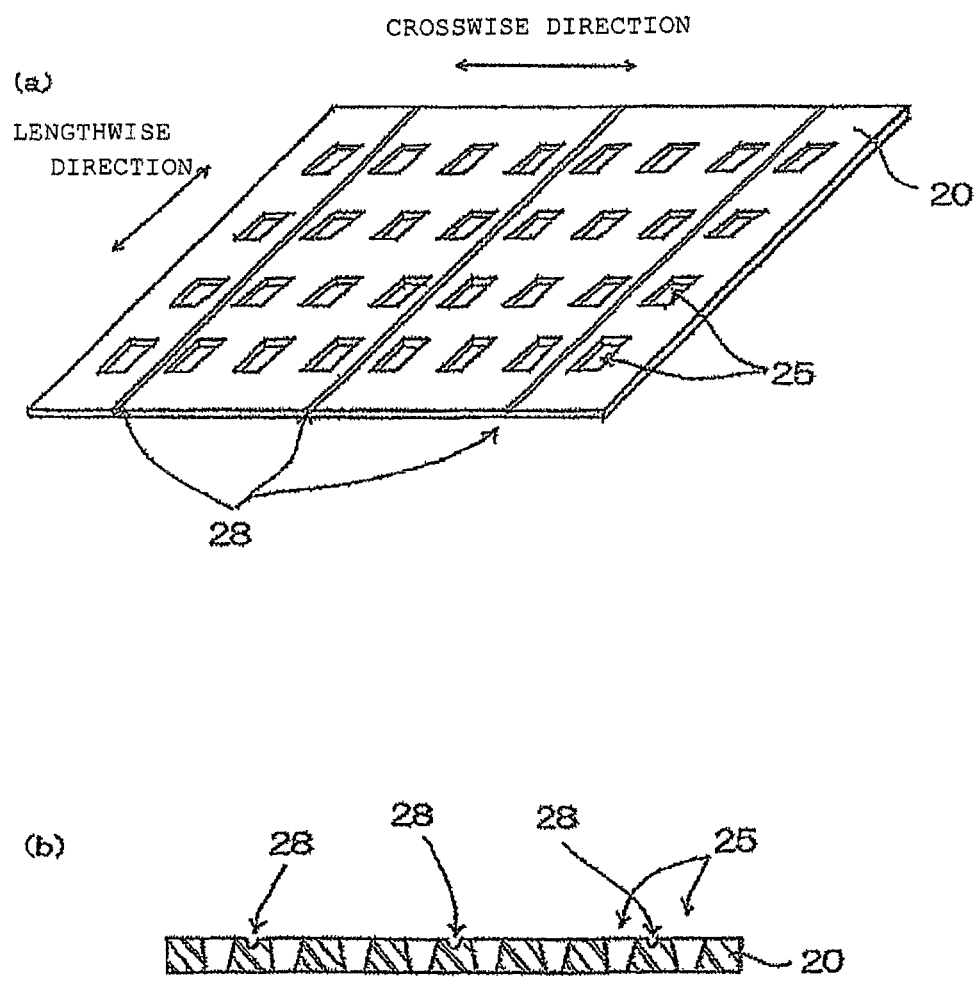
In FIG. 7, portion (a) is a perspective view of another aspect of the resin mask, and portion (b) is a cross-sectional view thereof.

In FIG. 7, portion (a) is a perspective view of another aspect of the resin mask, and portion (b) is its cross-sectional view.

As shown in FIG. 7, on the resin mask 20, grooves 28 are preferably formed to extend in the lengthwise direction or the crosswise direction of the resin mask 20 (the lengthwise direction in the case of FIG. 7). While in the case of application of heat in vapor deposition, there is a possibility that the resin mask 20 undergoes thermal expansion, and thereby, changes in dimension and position of the opening 25 arise, by forming the relevant grooves 28, they can absorb the expansion of the resin mask, and can prevent the changes in dimension and position of the opening 25 caused by the resin mask 20 expanding in a predetermined direction as a whole due to accumulation of thermal expansions arising in portions in the resin mask.

Notably, in FIG. 7, while grooves 28 extending between the openings 25 in the lengthwise direction are formed, not limited to these, grooves extending between the openings 25 in the crosswise direction may be formed. Furthermore, not limited to these between the openings 25, the grooves may be formed at positions of overlapping with the openings 25. Furthermore, the grooves can also be formed in an aspect having these combined.

While the depth and the width of the grooves 28 are not specially limited, since the rigidity of the resin mask 20 tends to decrease in the case where the depth of the grooves 28 is too large and in the case where the width thereof is too large, the setting is needed with this point taken into consideration. Moreover, the sectional shape of the grooves is not specially limited, but only has to be arbitrarily selected as a U-shape, a V-shape or the like with the processing method or the like taken into consideration.

Moreover, in the case where a magnet or the like is disposed at a rear side of the vapor deposition target to attract the vapor deposition mask 100 at a front side of the vapor deposition target with magnetic force, and thereby, the vapor deposition mask of an embodiment and the vapor deposition target are brought into close contact with each other when vapor deposition is performed on the vapor deposition target with use of the vapor deposition mask of an embodiment, a magnetic layer (not-shown) composed of a magnetic material is preferably provided on the surface of the resin mask 20 on the side that is not in contact with the metal mask 10. By providing the magnetic layer, the relevant magnetic layer and the vapor deposition target are caused to be attracted with magnetic force, the vapor deposition mask of an embodiment and the vapor deposition target are sufficiently brought into close contact with each other without a gap, and thickening of the vapor deposition pattern which can arise caused by the gap between the vapor deposition mask and the vapor deposition target can be prevented. Notably, the thickening of the vapor deposition pattern is a phenomenon that a vapor deposition pattern with a larger shape than that of the intended vapor deposition pattern is formed.

Metal Mask

Figure 15:
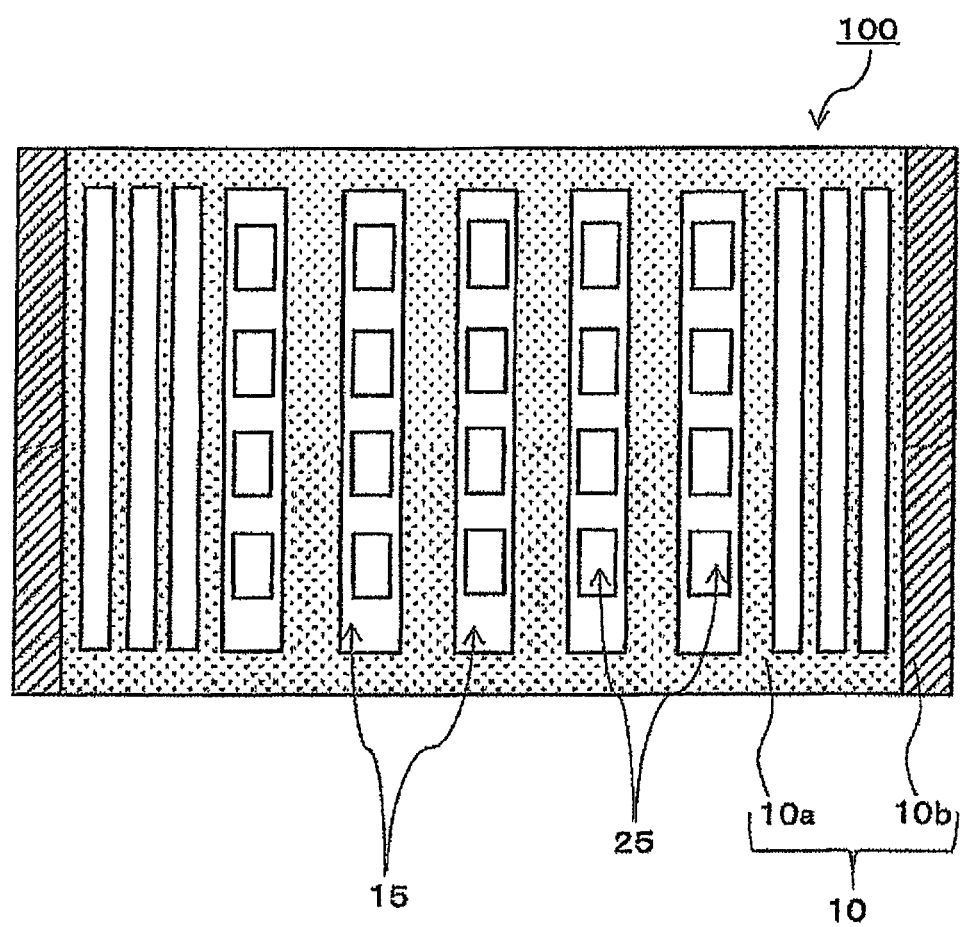
FIG. 15 is an elevation view of the vapor deposition mask of an embodiment as seen from the metal mask side.

The metal mask 10 is composed of a metal, in which the slits 15 in a plurality of rows extending in the lengthwise direction or the crosswise direction are arranged at the positions of overlapping the openings 25, in other words, at positions where all of the openings 25 arranged in the resin mask 20 can be seen, as seen head-on of the metal mask 10. Notably, this does not limit the slits 15 of the metal mask 10 in the present invention to be arranged at the positions where all of the openings 25 can be seen, but the slits 15 may be arranged such that a part of the openings 25 cannot be seen. Notably, in FIG. 1(b) and FIG. 2 to FIG. 4, the slits 15 extending in the lengthwise direction of the metal mask 10 are continuously arranged in the crosswise direction. Moreover, in the present invention, while the example in which the slits 15 in a plurality of rows in which the slits 15 extend in the lengthwise direction or the crosswise direction are arranged is exemplarily described, the slit 15 in only one row may be arranged in the lengthwise direction or the crosswise direction. Moreover, in the case where the slits 15 in a plurality of rows are arranged in the crosswise direction, a part of the relevant slits 15 arranged in a plurality of rows may be arranged at positions of not overlapping with the openings 25 as shown in FIG. 15. Notably, in FIG. 15, while the width of the slits not overlapping with the openings 25 in the crosswise direction is smaller than the width of the slits overlapping with the openings 25 in the crosswise direction, the width of the slits 15 not overlapping with the openings 25 in the crosswise direction may be the same width as the width of the slits overlapping with the openings 25 in the crosswise direction, or may be larger than that. Moreover, the slits 15 not overlapping with the openings in a plurality of rows may be arranged as shown in FIG. 15, or one in only one row may be arranged in the crosswise direction. Moreover, not shown in the drawings, the slits 15 not overlapping with the openings 15 may be provided so as to go across over the boundary between the general region 10a and the thick region 10b, or may be provided in the thick region 10b.

At the time of the description of the metal mask 10 in the present invention, with use of FIG. 8(a) to FIG. 8(c), relation between generation of a shadow and the thickness of the metal mask 10 is specifically described. As shown in FIG. 8(a), in the case where the thickness of the metal mask 10 is small, the vapor deposition material released from the vapor deposition source toward the vapor deposition target passes through the slit 15 of the metal mask 10 and the opening 25 of the resin mask 20 to reach the vapor deposition target without colliding with the inner wall surface of the slit 15 of the metal mask 10 and the surface of the metal mask 10 on the side that the resin mask 20 is not provided on. By doing so, the vapor deposition pattern can be formed on the vapor deposition target with a uniform film thickness. In other words, generation of a shadow can be prevented. Meanwhile, as shown in FIG. 8(b), in the case where the thickness of the metal mask 10 is large, for example, in the case where the thickness of the metal mask 10 is a thickness exceeding 25 µm, although due to the thickness, there is a merit that durability of the metal mask 10 can be improved and improvement of handling performance and reduction of the risks of rupture and deformation can be achieved, a part of the vapor deposition material released from the vapor deposition source collides with the inner wall surface of the slit 15 of the metal mask 10 and the surface of the metal mask 10 on the side that the resin mask 20 is not formed on, and cannot reach the vapor deposition target. As the vapor deposition material that cannot reach the vapor deposition target becomes more, a portion without vapor deposition that has a film thickness smaller than the intended vapor deposition film thickness arises more in the vapor deposition target, a shadow arising. In other words, in the metal mask, it can be said that improvement of durability and prevention of generation of a shadow are in trade-off relation.

Accordingly, in view of prevention of generation of a shadow, the thickness of the metal mask 10 is preferably as small as possible, is specifically preferably 25 µm or less, and is particularly preferably 15 µm or less. However, as the thickness of the metal mask 10 as a whole falls less below 25 µm, durability of the metal mask, for example, rigidity thereof decreases more, and rupture and deformation are more liable to arise in the metal mask 10, which moreover causes another problem that handling is made more difficult. In particular, in the case the vapor deposition mask is being upsized, these problems arise more significantly.

Therefore, according to the present invention, as shown in FIG. 1(a) and FIG. 2 to FIG. 4, the metal mask 10 has the general region 10a in which the slits 15 are formed and the thick region 10b larger in thickness than the relevant general region 10a. Further, the thick region 10b allows durability of the metal mask 10 to be improved. Moreover, since the slits 15 are formed in the general region 10a smaller in thickness than the thick region 10b, the slits 15 can be set that can prevent generation of a shadow while durability of the metal mask is secured.

In the mode of the metal mask shown in FIG. 1(a), the slits 15 are formed in the general region 10a, and the thick region 10b extending in the lengthwise direction is provided along the outer edge of the metal mask 10. The disposition place of the thick region 10b is not limited to the shown mode, but it only has to be properly disposed at a place where influence of a shadow hardly arises. Notably, the place where influence of a shadow hardly arises is determined based on positional relation between the vapor deposition source and the vapor deposition mask, any limitation to the disposition place of the thick region 10b is not made. For example, in the place where the vapor deposition material released from the vapor deposition source passes through at a degree of 90°±20° with respect to the slit 15 of the metal mask 10, even when the thick region 10b is disposed in the vicinity, there is almost no influence of a shadow. Accordingly, in such a case, as shown in FIGS. 2(c) and (d) and FIG. 3, the thick region 10b can also be disposed at a place other than the vicinity of the end part of the metal mask 10. Moreover, since the vicinity of the end part of the metal mask 10 is a region in which the slits are not formed irrespective of the positional relation between the vapor deposition source and the vapor deposition mask 100, it is preferable as the place where the thick region 10b is disposed.

Figure 13:
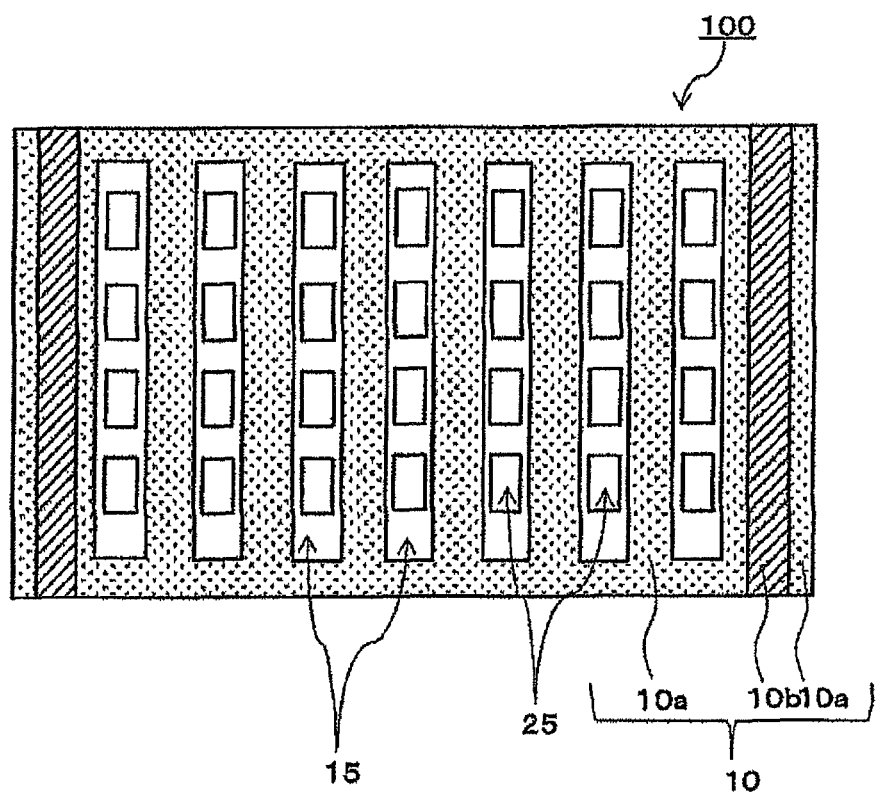
FIG. 13 is an elevation view of the vapor deposition mask of an embodiment as seen from the metal mask side.

Moreover, in the mode of the metal mask shown in FIG. 1(a), while the thick region 10b extending in the lengthwise direction is disposed along the outer edge of the metal mask 10, in this mode, the general region 10a may exist outward of the thick region 10b in the crosswise direction as shown in FIG. 13. In other words, that the thick region 10b is disposed in the vicinity of the end part of the metal mask is a concept including not only that the thick region 10b is disposed along the outer edge of the metal mask 10 but also that the thick region 10b is disposed in the vicinity of the outer circumference of the metal mask 10 such that the general region 10*a* is disposed along the outer edge of the metal mask. The same holds true for the metal masks 10 exemplified below.

FIGS. 2(*a*) to (*d*) are elevation views as seen from the metal mask side exemplarily showing disposition positions of the thick region 10*b*. In FIG. 2(*a*), the thick region 10*b* extending in the crosswise direction is disposed along the outer edge of the metal mask 10.

In FIG. 2(*b*), the thick region 10*b* extending in the lengthwise direction and the crosswise direction is disposed along the outer edge of the metal mask 10. Namely, the thick region 10*b* is disposed along the whole circumference of the outer edge of the metal mask 10. According to this mode, durability of the vapor deposition mask 100 can be further improved than with the metal masks 10 having the thick regions 10*b* shown in FIG. 1 and FIG. 2. In other words, the larger the region in which the thick region 10*b* is disposed is, the more the durability of the vapor deposition mask 100 can be improved. Notably, this does not limit the dimension of the disposition region of the thick region 10*b*, but durability can be improved more by an amount of the thick region 10*b* disposed than with the vapor deposition mask including the metal mask that the thick region 10*b* is not disposed in.

In FIG. 2(*c*), the thick region 10*b* extending in the lengthwise direction is disposed at the center position of the metal mask 10 in the crosswise direction, and in FIG. 2(*d*), the thick region 10*b* extending in the crosswise direction is disposed at the center position of the metal mask 10 in the lengthwise direction. Notably, in FIGS. 2(*c*) and (*d*), while the thick region 10*b* is disposed in the mode shown in FIG. 2(*b*), that is, in the whole circumference of the outer edge of the metal mask 10, and at the center position of the metal mask 10 in the crosswise direction or at the center position thereof in the lengthwise direction, it can be combined with the modes shown in FIG. 1(*a*) and FIG. 2(*b*).

Notably, in FIG. 2(*c*) and FIG. 2(*d*), while the thick region 10*b* in one row extending in the crosswise direction or the lengthwise direction is disposed at the center position in the lengthwise direction or at the center position in the crosswise direction, the thick regions in a plurality of rows extending in the lengthwise direction or the crosswise direction may exist. Moreover, the thick region 10*b* extending in the crosswise direction or the lengthwise direction may be disposed at a position other than the center position in the lengthwise direction and the center position in the crosswise direction.

Moreover, as shown in FIG. 3, the thick region 10*b* can also be disposed in a grid shape. The relevant mode is preferable in the case where the vapor deposition mask 100 is upsized and the similar case. Notably, in FIG. 3, the slits 15 are provided not only in the general region 10*a* but also in the thick region 10*b*. Specifically, in FIG. 3, the slits 15 in a plurality of rows extending in the lengthwise direction are provided so as to go across over the thick region 10*b* extending in the crosswise direction at the substantially center position of the metal mask 10 in the lengthwise direction. In other words, in this case, it can be said that the slits 15 are provided in the general region 10*a* and in the thick region 10*b*.

As shown in FIG. 1(*a*), FIG. 2 and FIG. 3, the thick region 10*b* may extend in the lengthwise direction or the crosswise direction, in other words, continue in strip shapes, or as shown in FIG. 4, the column-shaped thick regions 10*b* may be arranged at a predetermined interval. Notably, while FIG. 4 is a modification of the thick region 10*b* shown in FIG. 1(*a*), it can be diverted for various arrangement examples of the thick region 10*b*.

Figure 14:
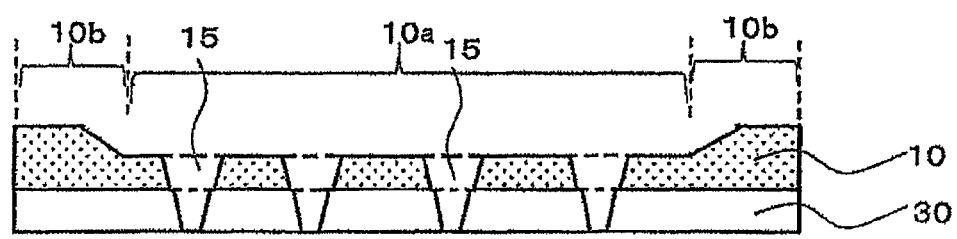
FIG. 14 is a schematic cross-sectional view of the vapor deposition mask of an embodiment.
Figure 14:
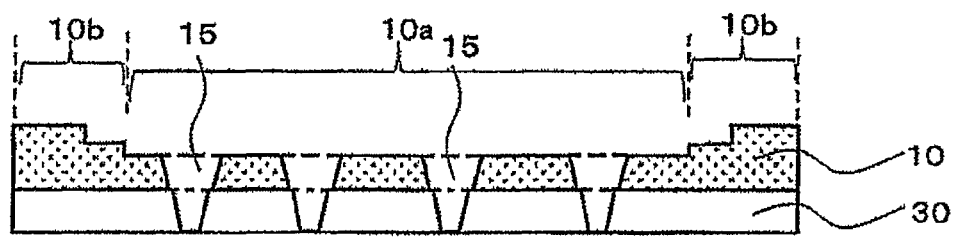

The sectional shape of the thick region 10*b* in its boundary portion to the general region 10*a* is not specially limited, but as shown in FIG. 1(*b*), the sectional shape may be set so as to steeply come into the thick region 10*b* from the general region 10*a*, or as shown in FIGS. 14(*a*) and (*b*), the sectional shape of the thick region may be set to be a tapered shape or a step-wise shape, so that the difference in thickness in the boundary between the general region 10*a* and the thick region 10*b* is set to be moderate in appearance.

The thickness of each of the above-mentioned general region 10*a* and thick region 10*b* is not specially limited, but the thickness of the general region 10*a* in which the slits 15 are formed is preferably a thickness with which there is no influence of a shadow and the vapor deposition pattern with high definition can be formed, specifically 25 µm or less, still preferably 15 µm or less. Its lower limit value is not specially limited, but 5 µm or more is preferable, and 10 µm or more is still preferable in view of metal processing precision. Notably, in the metal mask that does not have the thick region 10*b*, when the thickness of the metal mask is made small to be a thickness of 15 µm or less in order to prevent influence of a shadow, not only handling is made difficult but also the risks of rupture and deformation are made high. As described above, in the present invention, the presence of the thick region 10*b* improves durability of the metal mask 10, and as a result, handling performance and prevention of rupture and deformation are achieved. In other words, according to the metal mask 10 having the general region 10*a* and the thick region 10*b*, both the requirement for preventing generation of a shadow and the requirement for improving durability of the vapor deposition mask, the requirements being in trade-off relation, can be simultaneously satisfied.

The thickness of the thick region 10*b* is not specially limited, but as long as the condition that it is larger than the thickness of the general region 10*a* is satisfied, it can be properly set depending on the thickness of the general region 10*a*, the dimension of the metal mask 10, the deposition position of the thick region 10*b*, the deposition pattern of the thick region 10*b* and the like. In view of improvement of handling performance and reduction of the risks of rupture and deformation, the thickness of the thick region 10*b* satisfies the condition that it is not less than "the thickness of the general region 10*a* plus 5 µm", and is a thickness of 15 µm or more, preferably 25 µm or more. The upper limit value of the thickness of the thick region 10*b* is not specially limited, but 100 µm or less is preferable, 50 µm or less is still preferable, and 35 µm or less is particularly preferable. Notably, the thickness of the thick region 10*b* means "t" in FIG. 1(*b*).

The method for forming the metal mask 10 having the above-mentioned general region 10*a* and thick region 10*b* is not specially limited, but, for example, a metal plate in which slits are provided or slits are not provided is prepared, a metal member is bonded to the place in this metal plate to be the thick region 10*b* by using a conventionally known bonding method such as welding and adhesive, and thereby, the metal mask or the integrated metal plate in which the thick region 10*b* and the general region 10*a* are integrated together can be obtained. In this case, the total thickness of the thickness of the metal plate and that of the metal member is the thickness of the thick region 10*b*, and the thickness of the metal plate is the thickness of the general region 10*a* as it is. Moreover, in the case of setting the integrated metal plate in which the thick region 10b and the general region 10a are integrated together with use of the metal plate that the slits 15 are not provided in, after that, the slits 15 are formed in the general region 10a or in the thick region 10b as needed by using a conventionally known method, for example, the etching processing method or the laser processing method, and thereby, the metal mask 10 in which the general region 10a and the thick region 10b are integrated together can be obtained.

Other than the above, a metal plate in which slits are provided or slits are not provided is prepared, the surface of the metal plate that is finally to be the thick region 10b undergoes masking, the surface of the metal plate that has not undergone the relevant masking undergoes slimming processing, and thereby, the metal mask or the integrated metal plate in which the thick region 10b and the general region 10a are integrated together can be obtained. Details of the formation of the metal mask by slimming processing is mentioned later. In this case, the thickness of the metal plate is the thickness of the thick region 10b, and the thickness obtained by subtracting the thickness of the part that has undergone slimming processing from the thickness of the metal plate is the thickness of the general region 10a.

Figure 8:
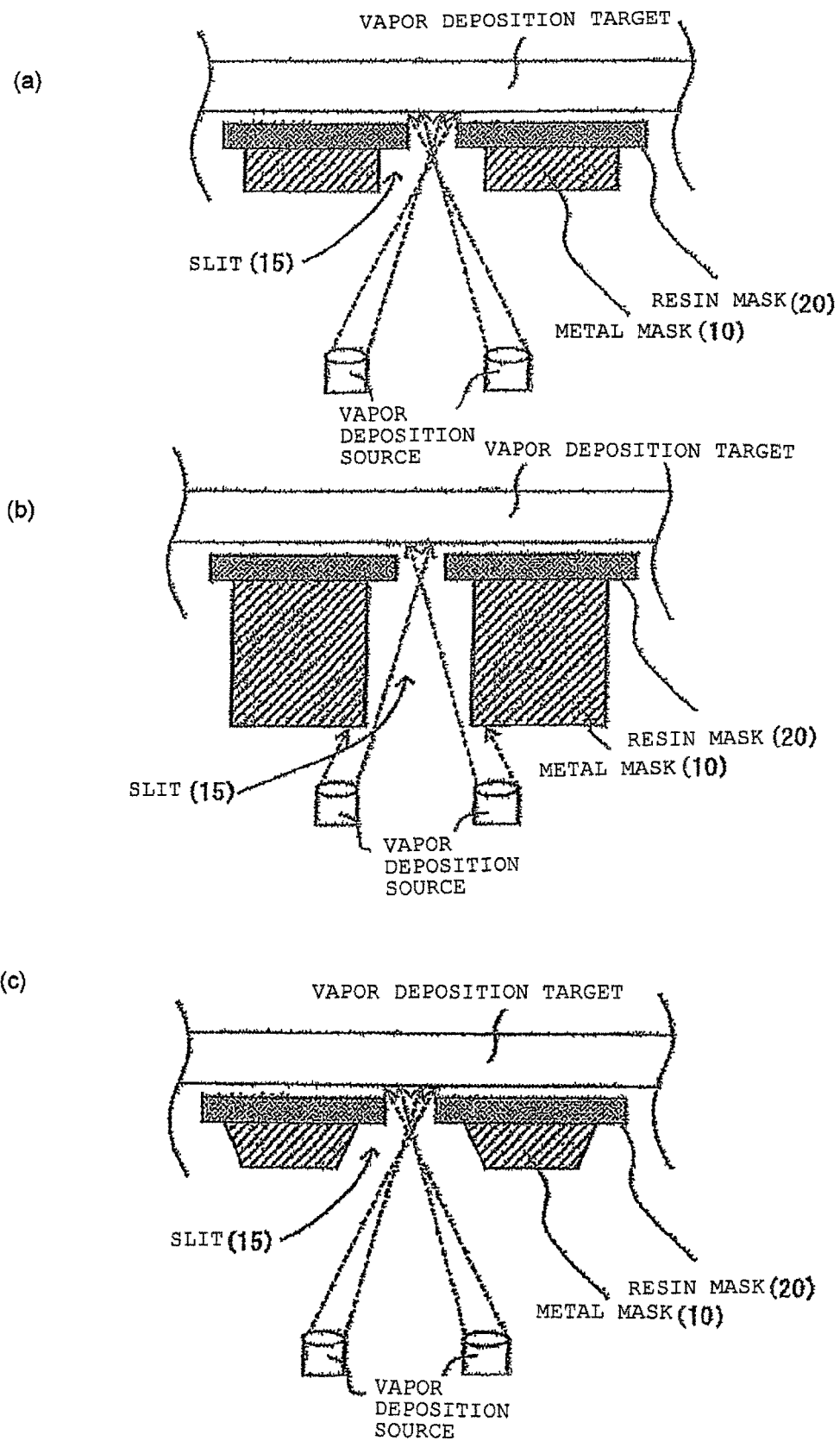
FIG. 8 is a schematic cross-sectional view showing relation between a shadow and the thickness of the metal mask.

Moreover, in order to further sufficiently prevent generation of a shadow in the metal mask having the above-mentioned general region 10a and thick region 10b, as shown in FIG. 1(b) and FIG. 6, the sectional shape of the slit 15 is preferably set to be a shape having broadening toward the vapor deposition source. By adopting the sectional shape like this, the vapor deposition material can be caused to reach the vapor deposition target without the vapor deposition material that is released from the vapor deposition source colliding with the relevant surface of the slit 15 and the inner wall surface of the slit 15 even when the thickness of the entire vapor deposition mask is made large with the objective of prevention of distortion that can occur to the vapor deposition mask 100, or improvement of durability. More specifically, the angle formed by a straight line connecting the lower bottom distal end in the slit 15 of the metal mask 10 and the upper bottom distal end in the slit 15 of the same metal mask 10 and the bottom surface of the metal mask 10 is, in other words, the angle formed by the inner wall surface in the slit 15 and the surface of the metal mask 10 on the side that is in contact with the resin mask 20 (a lower surface of the metal mask in the shown mode) in the cross section in the thickness direction of the inner wall surface composing the slit 15 of the metal mask 10 is preferably within a range of 5° to 85°, more preferably within a range of 15° to 80°, further preferably within a range of 25° to 65°. In particular, in this range, an angle that is smaller than the vapor deposition angle of the vapor deposition machine to be used is preferable. By setting the sectional shape like this, the deposition material can be caused to reach the vapor deposition target without the vapor deposition material released from the vapor deposition source colliding with the inner wall surface of the slit 15 even when the thickness of the metal mask 10 is made relatively large with the objective of prevention of distortion that can arise in the vapor deposition mask 100, or enhancement of durability. Thereby, generation of a shadow can be prevented more effectively. Notably, FIG. 8 shows partial schematic cross-sectional views for explaining relation between generation of a shadow and the slit 15 of the metal mask 10. Notably, in FIG. 8(c), while the slit 15 of the metal mask 10 has a sectional shape having broadening toward the vapor deposition source side, and the end surfaces that face each other of the opening 25 of the resin mask 20 are substantially parallel to each other, in order to more effectively prevent generation of a shadow, the sectional shapes of both the slit of the metal mask 10 and the opening 25 of the resin mask 20 are preferably shapes having broadening toward the vapor deposition source side.

A width W of the slit 15 (refer to FIG. 1(a)) is not specially limited, but it is preferably designed so as to be at least smaller than the pitch between the neighboring openings 25. Specifically, as shown in FIG. 1(a), in the case where the slit 15 extends in the lengthwise direction, the width W of the slit 15 in the crosswise direction is preferably smaller than the pitch P1 between the neighboring openings 25 in the crosswise direction. Likewise, not shown in the drawings, in the case where the slit 15 extends in the crosswise direction, the width of the slit 15 in the lengthwise direction is preferably smaller than the pitch P2 between the neighboring openings 25 in the lengthwise direction. Meanwhile, a length L in the lengthwise direction in the case where the slit 15 extends in the lengthwise direction is not specially limited, but it only has to be properly designed depending on the lengthwise length of the metal mask 10 and the positions of the openings 25 provided in the resin mask 20.

Figure 11:
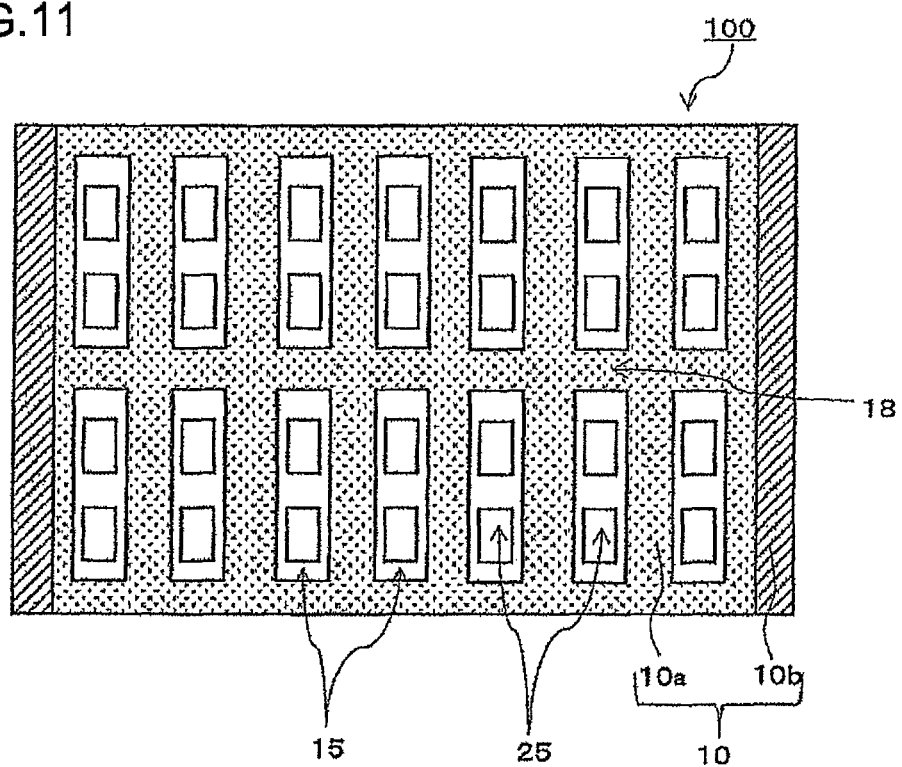
FIG. 11 is an elevation view of the vapor deposition mask of an embodiment as seen from the metal mask side.

Moreover, as shown in FIG. 11, the slit 15 continuously extending in the lengthwise direction or the crosswise direction may be divided to be plural by a bridge 18. Notably, FIG. 11 is an elevation view of the vapor deposition mask 100 as seen from the metal mask 10 side, and shows an example in which one slit 15 continuously extending in the lengthwise direction shown in FIG. 1(a) is divided to be plural (slits 15a and 15b) by the bridge 18. According to this mode, the synergistic effect of the thick region 10b and the bridge 18 can further improve durability of the metal mask 10, and can achieve handling performance and reduction of the risks of rupture and deformation. The width of the bridge 18 is not specially limited, but is preferably approximately 5 μm to 20 μm. By setting the width of the bridge 18 within this range, rigidity of the metal mask 10 can be effectively enhanced. The disposition position of the bridge 18 is not specially limited, but the bridge 18 is preferably disposed such that the slit after the division overlaps with two or more openings 25.

The sectional shape of the slit 15 formed in the metal mask 10 is not specially limited, but similarly to the above-mentioned openings 25 in the resin mask 20, it preferably has a shape having broadening toward the vapor deposition source as shown in FIG. 1(b) and FIG. 6.

The material of the metal mask 10 is not specially limited, but a conventionally known material in the field of the vapor deposition mask can be properly selected and used, and, for example, a metal material such as stainless steel, an iron-nickel alloy, and an aluminum alloy can be cited. Above all, an invar material that is an iron-nickel alloy can be preferably used since an invar material is hardly deformed by heat.

Moreover, when vapor deposition is performed on the substrate with use of the vapor deposition mask 100 of an embodiment of the present invention, in the case where a magnet or the like is needed to be disposed at a rear side of the substrate to attract the vapor deposition mask 100 at a front side of the substrate with magnetic force, the metal mask 10 is preferably formed of a magnetic substance. As the metal mask 10 made of the magnetic substance, iron-nickel alloy, pure iron, carbon steel, tungsten (W) steel, chromium (Cr) steel, cobalt (Co) steel, KS steel which is alloy of iron containing cobalt, tungsten, chromium and carbon, MK steel having iron, nickel and aluminum as main components, NKS steel having cobalt and titanium added to MK steel, Cu—Ni—Co steel, aluminum (Al)-iron (Fe) alloy, and the like can be cited. Moreover, when the material itself forming the metal mask 10 is not a magnetic substance, magnetism may be added to the metal mask 10 by dispersing powder of the above-mentioned magnetic substance in the relevant material.

Figure 12:
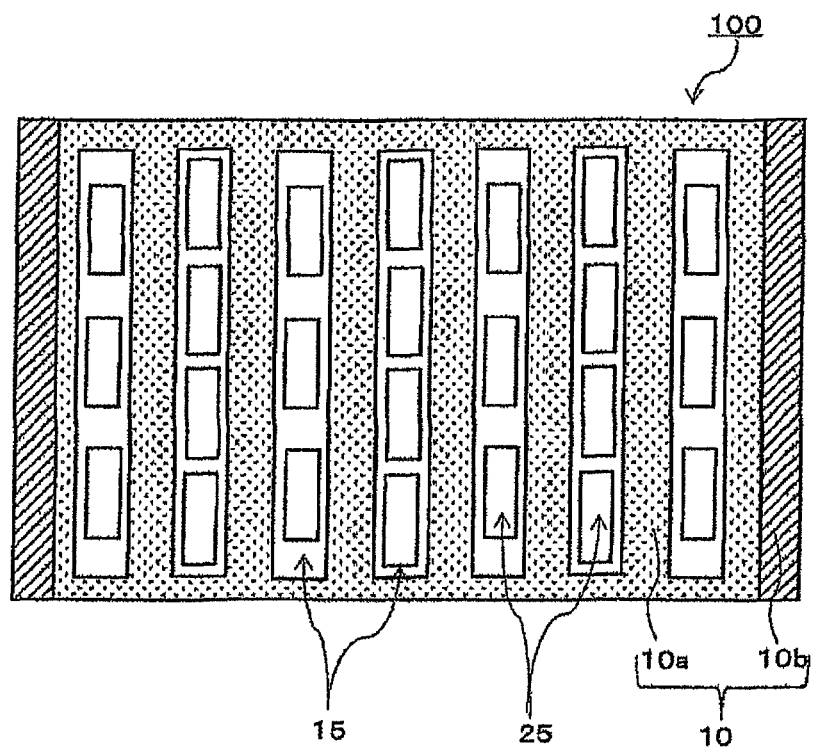
FIG. 12 is an elevation view of the vapor deposition mask of an embodiment as seen from the metal mask side.

FIG. 12 is an elevation view showing another aspect of the vapor deposition mask 100 of an embodiment of the present invention including the metal mask 10 having the general region 10a and the thick region 10b. As shown in FIG. 12, in the elevation view of the vapor deposition mask 100 as seen from the metal mask 10 side, the openings 25 which are formed in the resin mask 20 and seen through the slits 15 of the metal mask may be arranged alternately in the crosswise direction. In other words, the openings 25 adjacent in the crosswise direction may be arranged to be displaced in the lengthwise direction. By the arrangement in this way, even when the resin mask 20 undergoes thermal expansion, the openings 25 can absorb expansions arising in portions, and large deformation can be prevented from arising due to accumulation of the expansions. Moreover, as shown in FIG. 12, the opening 25 formed in the resin mask 20 is not needed to correspond to one pixel, but, for example, two pixels to ten pixels may be collectively one opening 25.

Figure 9:
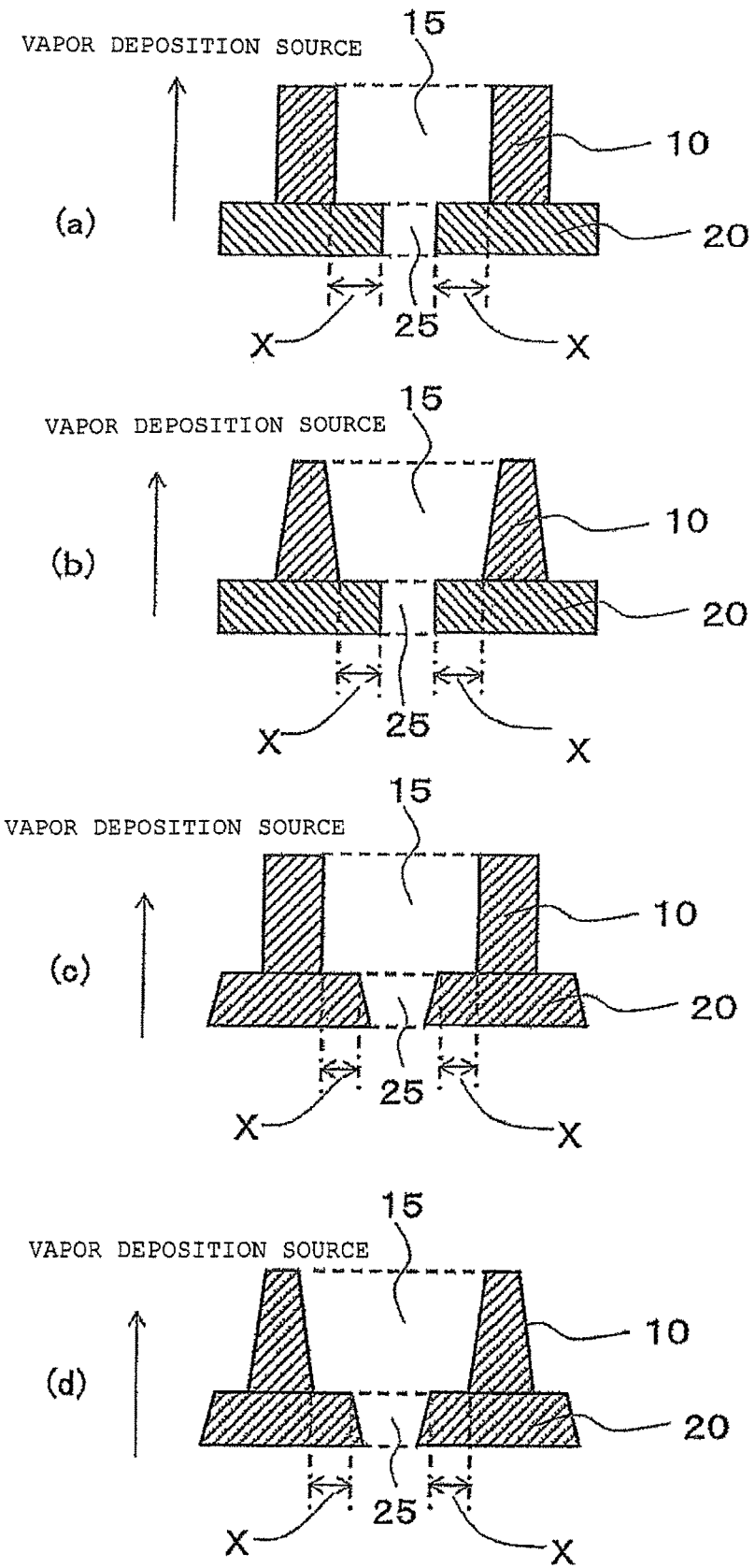
FIG. 9 shows partial schematic cross-sectional views representing relation between a slit of the metal mask and an opening of the resin mask.

FIGS. 9(a) to (d) are partial schematic cross-sectional views representing relation between the slit of the metal mask and the opening of the resin mask, and in the shown modes, the sectional shape of the whole opening formed by the slit 15 of the metal mask and the opening 25 of the resin mask looks step-wise. As shown in FIG. 9, by setting the sectional shape of the whole opening to be a step-wise shape having broadening toward the vapor deposition source side, generation of a shadow can be effectively prevented. In each of the sectional shapes of the slit 15 of the metal mask and the resin mask 20, while the surfaces that face each other may be substantially parallel to each other as shown in FIG. 9(a), only one of the slit 15 of the metal mask and the opening of the resin mask may have a sectional shape having broadening toward the vapor deposition source side as shown in FIGS. 9(b) and (c). Notably, as described above, in order to more effectively prevent generation of a shadow, both the slit 15 of the metal mask and the opening 25 of the resin mask preferably have sectional shapes having broadening toward the deposition source side as shown in FIG. 1(b), FIG. 6 and FIG. 9(d).

The width of a flat part (sign (X) in FIG. 9) in the cross section which is step-wise as above is not specially limited, but in the case where the width of the flat part (X) is less than 1 μm, the prevention effect of generation of a shadow tends to deteriorate due to the interference of the slit of the metal mask. Accordingly, with this point taken into consideration, the width of the flat part (X) is preferably 1 μm or more. The preferable upper limit value is not specially limited, but it can be properly set with the dimension of the opening of the resin mask, the distance between the neighboring openings and the like taken into consideration, and, by way of example, is approximately 20 μm.

Figure 10:
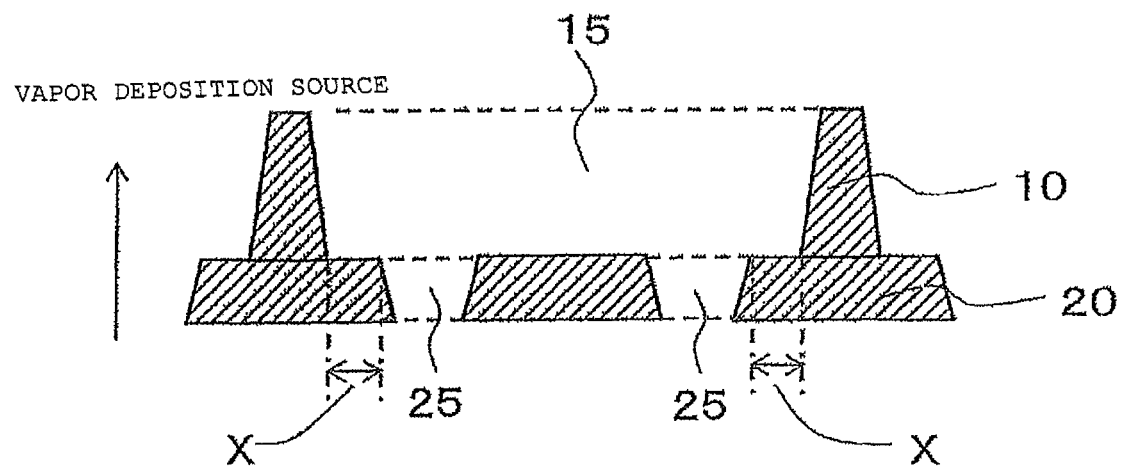
FIG. 10 is a partial schematic cross-sectional view representing relation between the slit of the metal mask and the openings of the resin mask.

Notably, in FIGS. 9(a) to (d), while the example in which one opening 25 overlapping with the slit 15 is provided in the crosswise direction in the case where the relevant slit extends in the lengthwise direction is shown, as shown in FIG. 10, two or more openings 25 overlapping with the slit 15 may be provided in the crosswise direction in the case where the relevant slit extends in the lengthwise direction. In FIG. 10, both the slit 15 of the metal mask and the opening 25 of the resin mask have sectional shapes having broadening toward the vapor deposition source side, and two or more openings 25 overlapping with the relevant slit 15 are provided in the crosswise direction.

Method for Producing Vapor Deposition Mask

Figure 16:
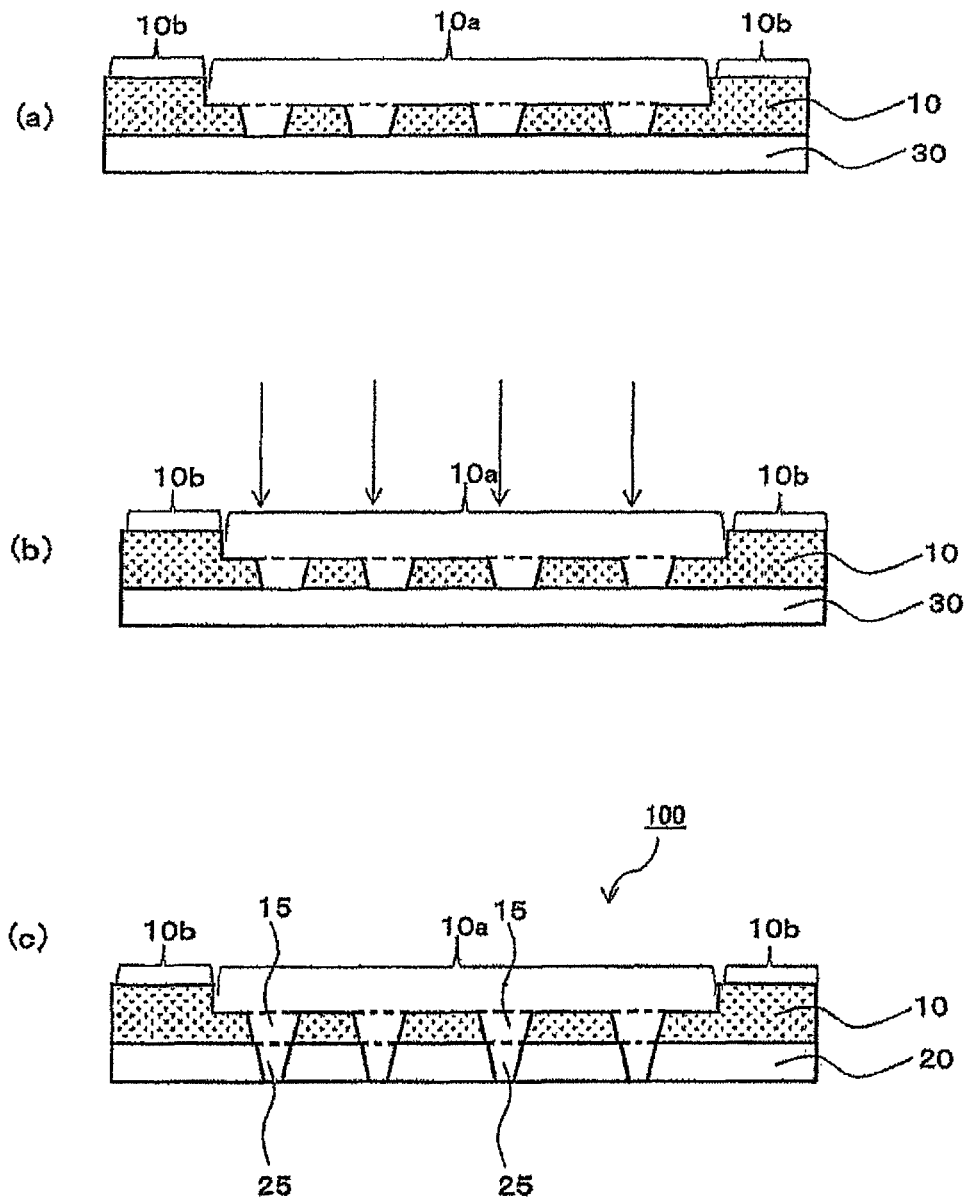
FIG. 16 is a step chart for explaining a method for producing a vapor deposition mask of an embodiment. Notably, all of portions (a) to (c) are cross-sectional views.

Next, a method for producing a vapor deposition mask of an embodiment of the present invention is described. As shown in FIG. 16, a method for producing the vapor deposition mask 100 of an embodiment of the present invention has a step of pasting the metal mask 10 in which the slits 15 are provided and a resin plate 30 together (refer to FIG. 16(a)), and a step of forming openings corresponding to a pattern to be produced by vapor deposition in the resin plate 30 (refer to FIG. 16(c)) by irradiation with laser from the metal mask side (refer to FIG. 16(b)), wherein as the metal mask 10, a metal mask having the general region 10a in which the slits 15 are provided and the thick region 10b larger in thickness than the general region 10a is used. Hereafter, the method for producing a vapor deposition mask of an embodiment of the present invention is specifically described.

FIG. 16 is a step chart for explaining the method for producing a vapor deposition mask. Notably, all of FIGS. 16(a) to (c) and FIGS. 17(a) to (h) are cross-sectional views.

Step of Pasting Metal Mask in which Slits are Provided and Resin Plate Together

When a stacked body having the metal mask 10 in which the slits are provided and the resin plate 30 pasted together shown in FIG. 16(a) is prepared, first, a metal mask in which slits are provided is prepared. In the present invention, as the metal mask 10 prepared here, the metal mask 10 having the general region 10a and the thick region 10b which is described for the above-mentioned vapor deposition mask 100 of an embodiment of the present invention is used. Hereafter, a preferable method for forming the metal mask 10 in which the slits 15 are provided and which has the general region 10a and the thick region 10b is exemplarily described.

Figure 17:
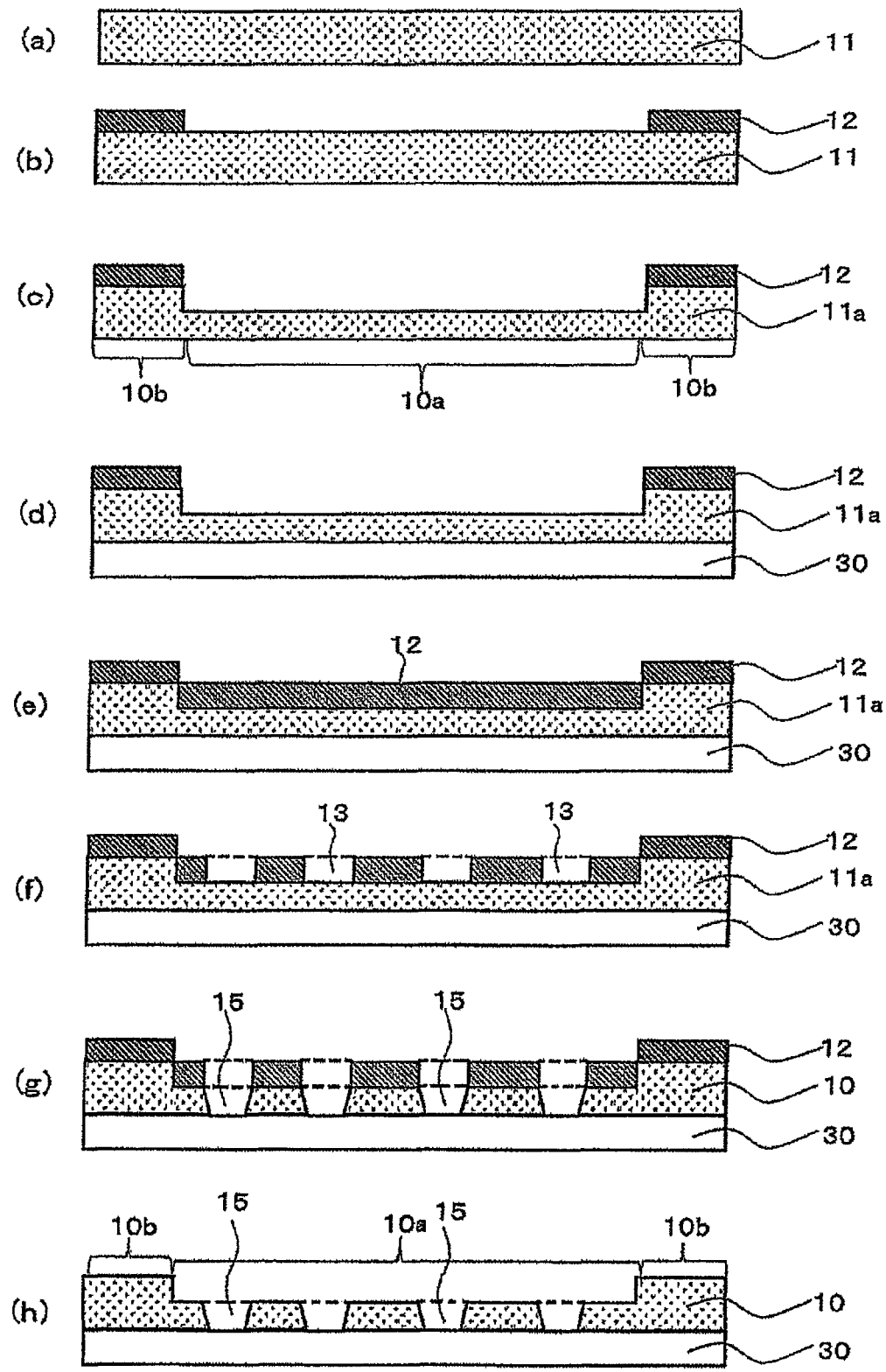
FIG. 17 is a step chart for explaining an example of a method for forming the metal mask. Notably, all of portions (a) to (h) are cross-sectional views.

In the method for forming the metal mask 10 by way of an example, a metal plate 11 is prepared as shown in FIG. 17(a). Next, as shown in FIG. 17(b), a portion of a surface of the metal plate 11 is masked with a masking member 12. As the masking member 12, for example, a resist material, a dry film or the like can be used. Notably, this portion that has undergone masking finally becomes the thick region 10b. Next, as shown in FIG. 17(c), by removing a region that does not undergo masking on the surface of the metal plate 11 by slimming processing within a range where the metal plate 11 that does not undergo masking is not penetrated, a metal plate 11a in which the general region 10a and the thick region 10b are integrated together is obtained. Notably, when the masking member 12 has resistance against a processing method used for forming the slits 15, it is not needed to be removed here.

As the slimming processing for forming the general region 10a, a conventionally known method that can remove the surface of the metal plate until its thickness becomes that of the general region 10a can be properly selected and used. For example, an etching processing method with use of an etching agent capable of performing etching processing on the metal plate 11 can be cited.

Next, as shown in FIG. 17(d), the metal plate 11a in which the general region 10a and the thick region 10b are integrated together and the resin plate 30 are pasted together. The method for this is also not specially limited, but, for example, various adhesives may be used, or a resin plate having self-adhesion may be used. Notably, while the dimensions of the metal plate 11a and the resin plate 30 may be the same, with fixing to a frame arbitrarily performed after that taken into consideration, the dimension of the resin plate 30 is preferably smaller than that of the metal plate 11a, so that the outer circumferential portion of the metal plate 11a is set to be in the state where it is exposed.

Next, as shown in FIG. 17(e), the masking member 12, for example, a resist material is applied onto the surface of the general region 10a which is on the side of the metal plate 11a that is not in contact with the resin plate 30. Notably, when the masking member that is used in the slimming step is removed, the masking member is also applied onto the surface of the thick region 10b. The masking member 12 described with FIG. 17(b) may be the same as or different from the masking member described here. As the resist material used as the masking member, one excellent in processing ability with desired resolution is used. After that, by exposure and development with use of a mask that a slit pattern is formed in, a resist pattern 13 is formed as shown in FIG. 17(f). Next, as shown in FIG. 17(g), etching processing is performed by an etching method with use of this resist pattern as an etching resistant mask. After the completion of the etching, the resist pattern is cleaned and removed. By doing so, as shown in FIG. 17(h), the metal mask 10 in which the desired slits 15 are formed in the metal plate 11a having the general region 10a and the thick region 10b is obtained.

In the above, while the example in which after the metal plate 11a having the general region 10a and the thick region 10b is pasted on the resin plate 30, the slits 15 are formed in the relevant metal plate 11a is described, the slits 15 may be formed in the metal plate 11a before the pasting on the resin plate. In this case, a method for simultaneously performing etching from both surfaces of the metal plate 11a may be used. As a method for pasting the metal mask 10 on the resin plate 30 after forming it in advance, the method described above can be used as it is.

Step of Fixing Metal Mask Pasted on Said Resin Plate to Frame

The relevant step is an arbitrary step in the production method of an embodiment of the present invention, the completed vapor deposition mask is not fixed to a frame but openings are provided later with respect to the resin plate in the state of being fixed to the frame, and therefore, positional precision can be extremely improved. Notably, in the case where the completed vapor deposition mask 100 is fixed to the frame, since the fixing is performed with the metal mask in which the openings are determined pulled with respect to the frame, precision in opening position coordinate is to decrease as compared with the case of having the present step.

The method for fixing the metal mask pasted on the resin plate to the frame is not specially limited, but, for example, a conventionally known step method such as spot welding only has to be properly adopted.

Moreover, in place of this method, after the metal mask 10 in which the slits 15 are formed and which has the general region 10a and the thick region 10b is fixed to the frame, the metal mask 10 fixed to the frame and the resin plate 30 may be pasted together. Also by this method, similarly to the above, positional precision of the openings can be extremely improved.

Step of Forming Openings Corresponding to Pattern to be Produced by Vapor Deposition in the Said Resin Plate by Irradiation with Laser from Metal Mask Side Next, as shown in FIG. 16(b), the openings 25 corresponding to the pattern to be produced by vapor deposition are formed in the resin plate 30 by irradiation with laser from the metal mask 10 side through the slit 15, to form the resin mask 20. The laser apparatus used here is not specially limited, but a conventionally known laser apparatus only has to be used. By doing so, the vapor deposition mask 100 of an embodiment of the present invention as shown in FIG. 16(c) is obtained.

Moreover, when the openings 25 are provided in the resin plate in the state of fixing to the frame, a reference sheet (not-shown) in which the pattern to be produced by vapor deposition, that is, the pattern corresponding to the openings 25 to be formed are beforehand provided may be prepared, and laser irradiation corresponding to the pattern of the reference sheet may be performed from the metal mask 10 side in the state where the reference sheet is pasted on the surface of the resin plate on the side that the metal mask 10 is not provided on. According to this method, the openings 25 can be formed by the laser irradiation performed, watching the pattern of the reference sheet pasted on the resin plate in the state of so-called face-to-face. Thereby, the openings 25 with high definition in which dimensional precision of the openings is extremely high can be formed. Moreover, since in this method, the openings 25 are formed in the state of being fixed to the frame, the vapor deposition mask is enabled to be excellent not only in dimensional precision but also in positional precision.

Notably, in the case of using the above-mentioned method, the pattern of the reference sheet is needed to be able to be recognized by the laser irradiation apparatus or the like from the metal mask 10 side via the resin plate 30. While the resin plate needs to have transparency in the case of having a thickness to some extent, in the case of the thickness preferable with the influence of a shadow taken into consideration, for example, in the case of the thickness of approximately 3 μm to 25 μm as described above, even a colored resin plate can be caused to recognize the pattern of the reference sheet.

A method for pasting the resin plate and the reference sheet together is not specially limited, but, for example, in the case where the metal mask 10 is a magnetic body, a magnet or the like is disposed at a rear side of the reference sheet, and the resin plate 30 of the resin plate-equipped metal mask and the reference sheet are pasted together by being attracted. Besides this, the pasting can be performed with use of the electrostatic adsorbing method or the like. As the reference sheet, for example, a TFT substrate having a predetermined opening pattern, a photo mask and the like can be cited.

Moreover, while the slimming step is described as the method for forming the general region 10a in the above, in the production method of an embodiment of the present invention, the slimming step may be performed between the steps described above, or after the steps. For example, while the thickness of the metal plate 11 becomes the thickness of the thick region 10b as it is in the method for forming the metal mask 10 described above, the thickness of the thick region 10b can also be adjusted by performing slimming as needed. Moreover, likewise, the thickness of the general region 10a can also be adjusted.

For example, in the case where as the resin plate 30 to be the resin mask 20 and the metal plate 11 to be the metal mask 10, ones larger in thickness than the preferable thicknesses described above, for example, a metal plate having a thickness larger than the thickness of the thick region 10b are used, excellent durability and transportability can be given in the case where the metal plate 11 or the resin plate 30 is solely transported during the production steps or the similar case. Meanwhile, in order to prevent generation of a shadow or the like, the thickness of the vapor deposition mask 100 obtained by the production method of an embodiment of the present invention is preferably the optimum thickness. The slimming step is a useful step in the case of optimizing the thickness of the vapor deposition mask 100 while satisfying durability and transportability during the production steps or after the steps.

The slimming of the metal mask 10 and the thick region 10b of the metal plate 11 can be realized by etching the surface of the metal mask 10 on the side that is not in contact with the resin plate 30 of the metal plate 11 or the surface of the metal mask 10 on the side that is not in contact with the resin plate 30 or the resin mask 20 with use of the etching agent capable of etching the metal plate 11 and the metal mask 10 between the steps described above, or after the steps. Notably, in this case, the general region 10a may be masked, so that the thickness of the general region 10a is not subjected to further change, or the adjustment of the thickness of the general region 10a may be performed simultaneously to the slimming of the thick region 10b. In this case, masking of the general region 10a is not needed.

The slimming of the resin plate 30 to be the resin mask 20 and the resin mask 20, that is, optimization of the thicknesses of the resin plate 30 and the resin mask 20 is similar to the above, and can be realized by etching the surface of the resin plate 30 on the side that is not in contact with the metal plate 11 or the metal mask 10 or the surface of resin mask 20 on the side that is not in contact with the metal mask 10 with use of the etching agent capable of etching the materials of the resin plate 30 and the resin mask 20 between any of the steps described above, or after the steps. Moreover, both the metal mask 10 and the resin mask 30 can undergo the etching processing after the vapor deposition mask 100 is formed, and thereby, the thicknesses of both of them can also be optimized.

Vapor Deposition Mask Preparation Body

Next, a vapor deposition mask preparation body of an embodiment of the present invention is described. The vapor deposition mask preparation body of an embodiment of the present invention is a vapor deposition mask preparation body for obtaining a vapor deposition mask including: a metal mask in which a slit is provided; and a resin mask in which openings corresponding to a pattern to be produced by vapor deposition are provided at a position of overlapping with the slit, the metal mask and the resin mask being stacked, wherein the metal mask in which the slit is provided is stacked on one surface of a resin plate, and the metal mask has a general region in which the slit is provided and a thick region larger in thickness than the general region.

The vapor deposition mask preparation body of an embodiment of the present invention is common to the above-described vapor deposition mask 100 of an embodiment of the present invention except in that the openings 25 are not provided in the resin plate 30, and its specific description is omitted. As a specific configuration of the vapor deposition mask preparation body, the resin plate-equipped metal mask prepared in the preparing step in the above-mentioned method for producing the vapor deposition mask (refer to FIG. 17(h)) can be cited.

According to the vapor deposition mask preparation body of an embodiment of the present invention, by forming the openings in the resin plate of the relevant vapor deposition mask preparation body, the vapor deposition mask capable of satisfying both high definition and lightweight in upsizing and forming a vapor deposition pattern with high definition can be obtained.

Method for Producing Organic Semiconductor Element

The method for producing an organic semiconductor element of an embodiment of the present invention has a step of forming a vapor deposition pattern in a vapor deposition method with use of a frame-equipped vapor deposition mask, and the frame-equipped vapor deposition mask described below is used in the relevant step of producing an organic semiconductor element.

The method for producing an organic semiconductor element of an embodiment having the step of forming the vapor deposition pattern in the vapor deposition method with use of the frame-equipped vapor deposition mask has an electrode forming step of forming an electrode on a substrate, an organic layer forming step, a counter electrode forming step, a sealing layer forming step, and the like, and in each of the arbitrary steps, the vapor deposition pattern is formed on the substrate in the vapor deposition method with use of the frame-equipped vapor deposition mask. For example, in the case where the vapor deposition method using the frame-equipped vapor deposition mask is applied to each of light-emitting layer forming steps for colors of R, G and B of an organic EL device, the vapor deposition patterns of light-emitting layers for the respective colors are formed on the substrate. Notably, the method for producing an organic semiconductor element of an embodiment of the present invention is not limited to these steps, but can be applied to an arbitrary step in producing a conventionally known organic semiconductor element with use of a vapor deposition method.

In the method for producing an organic semiconductor element of an embodiment of the present invention, in the above-mentioned step of forming the vapor deposition pattern, the vapor deposition mask fixed to the frame is the vapor deposition mask of an embodiment of the present invention described above.

As the organic semiconductor element produced in the method of the present invention, for example, organic layers, light-emitting layers, cathode electrodes and the like of an organic EL element can be cited. In particular, the method for producing an organic semiconductor element of the present invention can be preferably used for producing light-emitting layers of R, G and B of an organic EL element for which high definition pattern precision is required.

Figure 18:
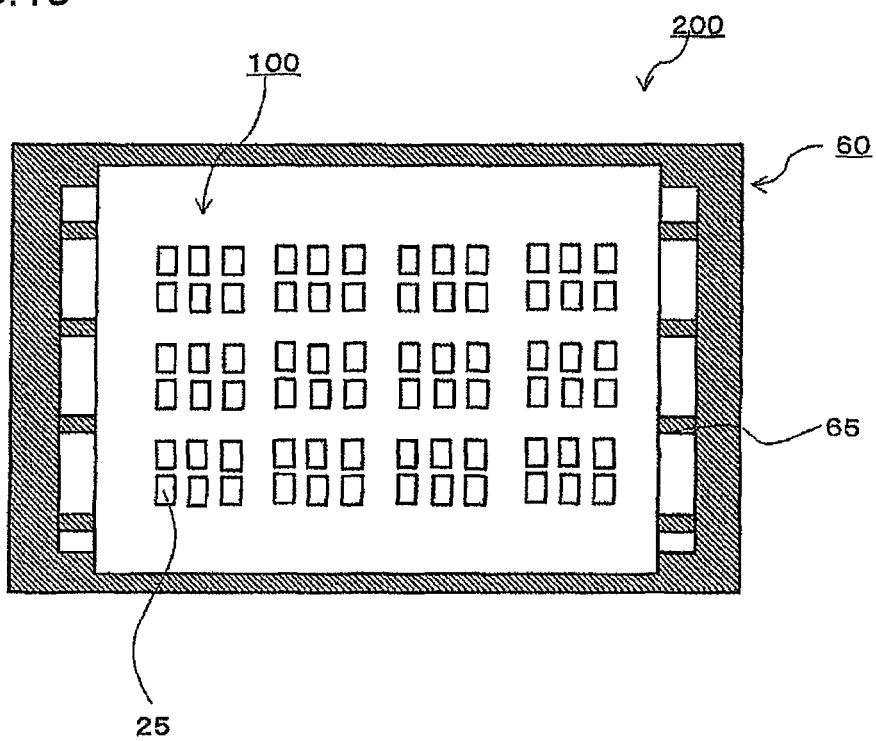
FIG. 18 is an elevation view of a frame-equipped vapor deposition mask of an embodiment as seen from the resin mask side.
Figure 19:
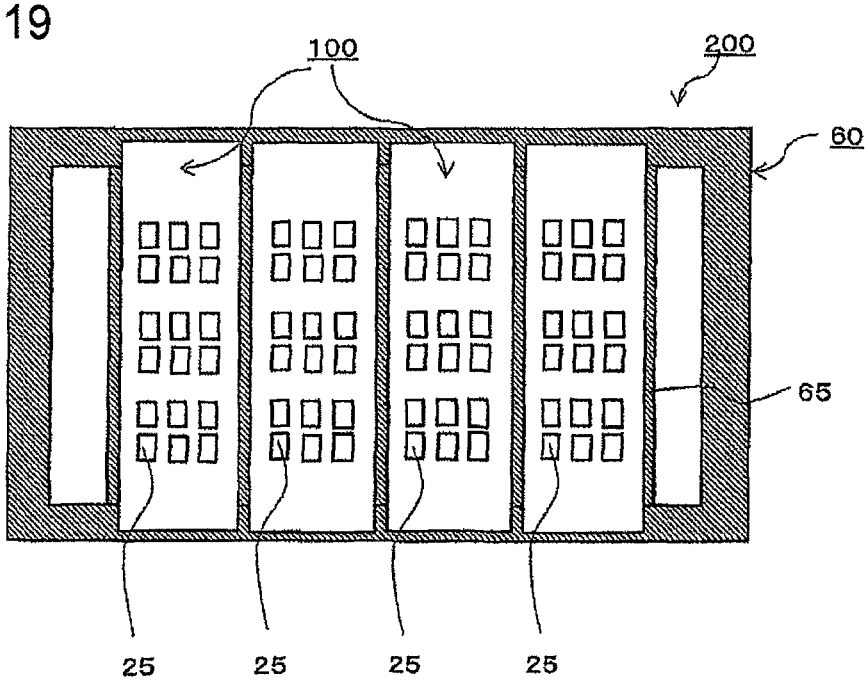
FIG. 19 is an elevation view of a frame-equipped vapor deposition mask of an embodiment as seen from the resin mask side.

The frame-equipped vapor deposition mask used for producing the organic semiconductor element only has to satisfy the condition that the vapor deposition mask of an embodiment of the present invention described above is fixed to the frame, and is not specially limited in other conditions. The frame is not specially limited, but may be a member that can support the vapor deposition mask, and, for example, a metal frame, a ceramic frame or the like can be used. Above all, the metal frame is preferable since it is easily welded to the metal mask of the vapor deposition mask, and influence such as deformation is small. Hereafter, an example in which a metal frame is used as the frame is mainly described. For example, as shown in FIG. 18, a metal frame-equipped vapor deposition mask 200 in which one vapor deposition mask 100 is fixed to a metal frame 60 may be used, or as shown in FIG. 19, a frame-equipped vapor deposition mask 200 in which a plurality of vapor deposition masks (four vapor deposition masks in the shown mode) are fixed to a metal frame 60 to line up in the lengthwise direction or the crosswise direction (fixed to line up in the crosswise direction in the shown mode) may be used. Notably, each of FIG. 18 and FIG. 19 is an elevation view of the metal frame-equipped vapor deposition mask 200 of an embodiment as seen from the resin mask 20 side.

The metal frame 60 is a frame member in a substantially rectangular shape, and has an opening for exposing the openings 25 provided in the resin mask 20 of the vapor deposition mask 100 which is finally fixed, to the vapor deposition source side. The material of the metal frame is not specially limited, but a metal material large in rigidity such, for example, as SUS and an invar material is preferable.

The thickness of the metal frame is not specially limited, but is preferably approximately 10 mm to 30 mm in view of rigidity and the like. The width between the inner circumferential end face of the opening of the metal frame and the outer circumferential end face of the metal frame is not specially limited as long as it is a width with which the relevant metal frame can be fixed to the metal mask of the vapor deposition mask, but, for example, can be exemplarily a width of approximately 10 mm to 50 mm.

Moreover, a reinforcement frame 65 or the like may exist in the opening of the metal frame within a range where the exposure of the openings 25 of the resin mask 20 composing the vapor deposition mask 100 is not prevented. In other words, the opening included in the metal frame 60 may have a configuration in which it is divided by a reinforcement frame or the like. In the mode shown in FIG. 18, while a plurality of reinforcement frames 65 extending in the crosswise direction are arranged in the lengthwise direction, in place of these reinforcement frames 65 or along with these, a plurality of rows of reinforcement frames extending in the lengthwise direction may be arranged in the crosswise direction. Moreover, in the mode shown in FIG. 19, while a plurality of reinforcement frames 65 extending in the lengthwise direction are arranged in the crosswise direction, in place of these reinforcement frames 65 or along with these, a plurality of reinforcement frames extending in the crosswise direction may be arranged in the lengthwise direction. By using the metal frame 60 in which the reinforcement frames 65 are arranged, when the plurality of vapor deposition masks 100 of an embodiment of the present invention are fixed to the metal frame 60 to line up in the lengthwise direction and the crosswise direction, the vapor deposition masks can be fixed to the metal frame 60 even when the vapor deposition masks are placed at positions of overlapping with the reinforcement frames.

A method of fixing the metal frame 60 to the vapor deposition mask 100 of an embodiment of the present invention is not specially limited, but the fixing can be performed by using spot welding of fixing with laser light or the like, an adhesive, screw fixing or the like.

REFERENCE SIGNS LIST

10 Metal mask
10a General Region
10b Thick Region
15 Slit
18 Bridge
20 Resin mask
25 Opening
60 Metal frame
100 Vapor deposition mask
200 Frame-equipped vapor deposition mask

The invention claimed is:

1. A method for producing an organic semiconductor element, comprising
a step of forming a vapor deposition pattern on a vapor deposition target by using a support-equipped vapor deposition mask in which a vapor deposition mask is fixed to a metal support member, wherein
the vapor deposition mask includes: a metal mask in which a through-hole is provided; and a resin mask in which openings corresponding to a pattern to be produced by vapor deposition are provided at a position overlapping the through-hole,
wherein the metal mask and the resin mask are stacked,
wherein the resin mask has a first surface arranged to face the vapor deposition target and an opposed second surface,
wherein the metal mask covers at least a portion of the second surface of the resin mask,
wherein the metal mask has a general region in which the through-hole is provided and a thick region larger in thickness than the general region, and
wherein the through-hole in the metal mask is tapered inwardly toward the second surface of the resin mask.

2. The method according to claim 1, wherein a thickness of the general region is from 5 μm to 25 μm.

3. The method according to claim 1, wherein a thickness of the thick region is larger than 5 μm.

4. The method according to claim 1, wherein a thickness of the thick region is larger than 5 μm and a total thickness of the metal mask is 15 μm-100 μm.

5. The method according to claim 1, wherein the general region is surrounded by the thick region.

6. The method according to claim 1, wherein the thick region extends longitudinally and separates two general regions, each including a separate through-hole.

7. The method according to claim 1, wherein the thick region forms a grid surrounding a plurality of through-holes.

8. The method according to claim 1, wherein the metal support member is welded to the metal mask.

9. The method according to claim 1, wherein the metal mask has a total area and the general region occupies a greater proportion of the total area than the thick region.

10. The method according to claim 1, wherein the metal support member is made of an invar material.

11. The method according to claim 1, wherein the openings in the resin mask are each defined by an inner surface that forms an angle $\theta_1$ with respect to the first surface of the resin mask and the through-hole in the metal mask forms an angle $\theta_2$ with respect to the first surface of the resin mask, and wherein $\theta_1 > \theta_2$.

12. A method for producing an organic electroluminescence element, comprising
a step of forming a light-emitting layer of the organic electroluminescence element on a vapor deposition target by using a support-equipped vapor deposition mask in which a vapor deposition mask is fixed to a metal support member having a rectangular shape, wherein
the vapor deposition mask includes: a metal mask in which a through-hole is provided; and a resin mask in which openings corresponding to a pattern of the light-emitting layer to be produced by vapor deposition are provided at a position overlapping the through-hole,
wherein the metal mask and the resin mask are stacked,
wherein the resin mask has a first surface arranged to face the vapor deposition target and an opposed second surface,
wherein the metal mask covers at least a portion of the second surface of the resin mask,
wherein the metal mask has a general region in which the through-hole is provided and a thick region larger in thickness than the general region, and
wherein the through-hole in the metal mask is tapered inwardly toward the second surface of the resin mask.

13. A method for producing an organic electroluminescence element, comprising
a step of forming a light-emitting layer of the organic electroluminescence element on a vapor deposition target by using a vapor deposition mask, wherein
the vapor deposition mask includes: a rectangular metal mask in which a through-hole is provided; and a rectangular resin mask in which openings corresponding to a pattern of the light-emitting layer to be produced by vapor deposition are provided at a position overlapping the through-hole,
wherein the metal mask and the resin mask are stacked,
wherein the resin mask has a first surface arranged to face the vapor deposition target and an opposed second surface,
wherein the metal mask covers at least a portion of the second surface of the resin mask,
wherein the metal mask has a general region in which the through-hole is provided and a thick region larger in thickness than the general region,
wherein the thick region is positioned on the outer edge of the metal mask, and
wherein the through-hole in the metal mask is tapered inwardly toward the second surface of the resin mask.

14. A method for producing an organic electroluminescence element, comprising
a step of forming a light-emitting layer of the organic electroluminescence element on a vapor deposition target by using a vapor deposition mask, wherein
the vapor deposition mask includes: a rectangular metal mask in which a through-hole is provided; and a rectangular resin mask in which openings corresponding to a pattern of the light-emitting layer to be produced by vapor deposition are provided at a position overlapping the through-hole,
wherein the metal mask and the resin mask are stacked,
wherein the resin mask has a first surface arranged to face the vapor deposition target and an opposed second surface,
wherein the metal mask covers at least a portion of the second surface of the resin mask,
wherein the metal mask has a general region in which the through-hole is provided and a thick region larger in thickness than the general region,
wherein the thick region is arranged in a grid shape, and
wherein the through-hole in the metal mask is tapered inwardly toward the second surface of the resin mask.

* * * * *